(12) United States Patent
Tao et al.

(10) Patent No.: US 12,707,760 B2
(45) Date of Patent: Aug. 11, 2026

(54) SOLAR CELL AND PHOTOVOLTAIC MODULE

(71) Applicants: ZHEJIANG JINKO SOLAR CO., LTD., Haining (CN); JINKO SOLAR CO., LTD., Jiangxi (CN)

(72) Inventors: Wusong Tao, Haining (CN); Ningbo Zhang, Haining (CN); Luchuang Wang, Haining (CN); Yingying Peng, Haining (CN); Zhiqiu Guo, Haining (CN)

(73) Assignees: ZHEJIANG JINKO SOLAR CO., LTD., Haining (CN); JINKO SOLAR CO., LTD., Jiangxi (CN)

( * ) Notice: Subject to any disclaimer, the term of this patent is extended or adjusted under 35 U.S.C. 154(b) by 28 days.

(21) Appl. No.: 18/638,581

(22) Filed: Apr. 17, 2024

(65) Prior Publication Data

US 2025/0248169 A1 Jul. 31, 2025

(30) Foreign Application Priority Data

Jan. 31, 2024 (CN) ........................ 202410139692.1
Jan. 31, 2024 (CN) ........................ 202420246632.5

(51) Int. Cl.
*H10F 77/20* (2025.01)
*H10F 19/80* (2025.01)
(Continued)

(52) U.S. Cl.
CPC ........... *H10F 77/937* (2025.01); *H10F 19/80* (2025.01); *H10F 19/904* (2025.01);
(Continued)

(58) Field of Classification Search
CPC .... H10F 77/937; H10F 77/211; H10F 77/215; H10F 19/90–906
See application file for complete search history.

(56) References Cited

U.S. PATENT DOCUMENTS 6,262,359 B1 * 7/2001 Meier .................. H10F 10/146
136/258
2016/0172510 A1 6/2016 Bitnar
(Continued)

FOREIGN PATENT DOCUMENTS

CN 202076273 U 12/2011
CN 202957261 U 5/2013
(Continued)

OTHER PUBLICATIONS

English machine translation of Kondo et al. (WO 2013/125673) published Aug. 29, 2013.*
(Continued)

*Primary Examiner* — Christina Chern
(74) *Attorney, Agent, or Firm* — USCH Law, PC

(57) ABSTRACT

A solar cell is provided, including: a substrate including a center region and edge regions respectively arranged on two opposing sides of the center region, fingers arranged at intervals along the first direction and extending along a second direction, pad groups arranged at intervals along the second direction, and busbars arranged at intervals along the second direction. The fingers including a number of fingers in the center region, each pad group includes pads arranged at intervals along the first direction, and the pads include a number of pads in the center region that are respectively connected to the number of fingers in the center region. Each busbar is connected to a respective pad group of some of the pad groups, and at least one pad group is disposed between two adjacent busbars.

20 Claims, 7 Drawing Sheets

(51) Int. Cl.
*H10F 19/90* (2025.01)
*H10F 77/00* (2025.01)
*H02S 50/10* (2014.01)

(52) U.S. Cl.
CPC ......... *H10F 19/908* (2025.01); *H10F 77/215* (2025.01); *H02S 50/10* (2014.12)

(56) References Cited

U.S. PATENT DOCUMENTS

| | | | | |
|---|---|---|---|---|
| 2017/0271540 | A1 | 9/2017 | Chang et al. | |
| 2020/0075788 | A1* | 3/2020 | Oh | H10F 77/211 |
| 2022/0173261 | A1 | 6/2022 | Bettinelli | |

FOREIGN PATENT DOCUMENTS

| | | | | |
|---|---|---|---|---|
| CN | 203071087 | U | 7/2013 | |
| CN | 103811566 | A | 5/2014 | |
| CN | 204332976 | U | 5/2015 | |
| CN | 105870209 | A | 8/2016 | |
| CN | 106206771 | A | 12/2016 | |
| CN | 107895748 | A | 4/2018 | |
| CN | 109119497 | A | 1/2019 | |
| CN | 208889668 | U | 5/2019 | |
| CN | 110416327 | A | 11/2019 | |
| CN | 111354802 | A | 6/2020 | |
| CN | 211700309 | U | 10/2020 | |
| CN | 112447864 | A | 3/2021 | |
| CN | 112701190 | A | 4/2021 | |
| CN | 113644144 | A * | 11/2021 | H10F 77/219 |
| CN | 115172484 | A | 10/2022 | |
| CN | 115579407 | A | 1/2023 | |
| CN | 218333813 | U | 1/2023 | |
| CN | 218631927 | U | 3/2023 | |
| CN | 116154009 | A | 5/2023 | |
| CN | 218957750 | U | 5/2023 | |
| CN | 116454142 | A | 7/2023 | |
| CN | 116632075 | A | 8/2023 | |
| CN | 116964755 | A | 10/2023 | |
| JP | 2007103535 | A | 4/2007 | |
| JP | 2009081204 | A | 4/2009 | |
| JP | 3185889 | U | 9/2013 | |
| JP | 2015079858 | A | 4/2015 | |
| JP | 2015095609 | A | 5/2015 | |
| JP | 2016072601 | A | 5/2016 | |
| JP | 2020061551 | A | 4/2020 | |
| JP | 2020513168 | A | 4/2020 | |
| JP | 2024003734 | A | 1/2024 | |
| JP | 2024169256 | A | 12/2024 | |
| WO | 2005104242 | A1 | 11/2005 | |
| WO | WO-2013125673 | A1 * | 8/2013 | H10F 19/906 |
| WO | 2018003563 | A1 | 1/2018 | |
| WO | 2018207312 | A1 | 11/2018 | |
| WO | 2023280308 | A1 | 1/2023 | |

OTHER PUBLICATIONS

English machine translation of Ou et al. (CN 113644144) published Nov. 12, 2021.*

English machine translation of Zhang et al. (CN 218333813) published Jan. 17, 2023.*

English machine translation of Ding et al. (CN 211700309) published Oct. 16, 2020.*

Zhejiang Jinko Solar Co., Ltd., CN First Office Action with English Translation, CN 2024101396921, Mar. 22, 2024, 19 pgs.

Changji Hu, et al., "Photovoltaic module design and production process", Beijing Institute of Technology Press, Jan. 31, 2015, P56, 2 pgs.

Zhejiang Jinko Solar Co., Ltd. et al., Extended European Search Report, EP 24170654.8, Oct. 9, 2024, 56 pgs.

Zhejiang Jinko Solar Co., Ltd. et al., Japan Notice of Grant with English Translation, JP2024067875, Jul. 10, 2025, pgs.

Zhejiang Jinko Solar Co., Ltd et al., Communication pursuant to Article 94(3) EPC, EP 24170654.8, Mar. 18, 2026, 5 pgs.

* cited by examiner

SOLAR CELL AND PHOTOVOLTAIC MODULE

CROSS-REFERENCE TO RELATED APPLICATION

The present disclosure claims the benefit of priorities under the Paris Convention to Chinese Patent Application 202420246632.5 filed on Jan. 31, 2024 and Chinese Patent Application 202410139692.1 filed on Jan. 31, 2024, each of which is incorporated herein by reference in its entirety.

TECHNICAL FIELD

Embodiments of the present disclosure relate to the field of photovoltaics, and more particularly to a solar cell and a photovoltaic module.

BACKGROUND

Fossil energy causes atmospheric pollution and has limited reserves, while solar energy has advantages such as being clean, pollution-free and abundant in resources. Therefore, solar energy is gradually becoming core clean energy in place of fossil energy. Solar cells have become the development focus of clean energy utilization due to good photovoltaic conversion efficiency.

The photovoltaic module is one of important components of a solar electricity production device. Sunlight shines onto a front surface of the solar cell. The solar cell includes a substrate and busbars and fingers that are disposed on the front surface of the substrate, and the busbars and the fingers cover a part of the front surface of the substrate. To save paste, a solar cell without busbars has been produced.

SUMMARY

Embodiments of the present disclosure provide a solar cell and a photovoltaic module, which is at least conducive to testing of the solar cell and saving paste.

Some embodiments of the present disclosure provide a solar cell including: a substrate including a center region and edge regions, where the edge regions are respectively arranged on two opposing sides of the center region; a plurality of fingers arranged at intervals along a first direction, each of plurality of fingers extending along a second direction, the plurality of fingers including a number of fingers in the center region; a plurality of pad groups arranged at intervals along the second direction, where each pad group of the plurality of pad groups includes a plurality of pads arranged at intervals along the first direction, and the plurality of pads include a number of pads in the center region that are respectively connected to the number of fingers in the center region; and a plurality of busbars arranged at intervals along the second direction, where each of the plurality of busbars is connected to a respective pad group of some of the plurality of pad groups, and at least one of the plurality of pad groups is disposed between two adjacent busbars of the plurality of busbars.

In some embodiments, any two adjacent busbars of the plurality of busbars are spaced apart from each other by at least one of the plurality of pad groups.

In some embodiments, some two adjacent busbars of the plurality of busbars are spaced apart from each other by one of the plurality of pad groups, and some two adjacent busbars of the plurality of busbars are spaced apart from each other by at least two of the plurality of pad groups.

In some embodiments, the plurality of busbars include: first busbars, where each of the first busbars is connected to all pads of a respective one of the plurality of pad groups; and second busbars, where each of the second busbars is connected to some pads of a respective one of the plurality of pad groups.

In some embodiments, a respective one of the first busbars and a respective one of the second busbars that are adjacent to each other are spaced apart from each other by at least one of the plurality of pad groups.

In some embodiments, each of the first busbars has a width of in the second direction that is greater than a width of any of the second busbars in the second direction.

In some embodiments, the substrate includes a front surface and a rear surface opposite to each other, where both the front surface and the rear surface are provided with the plurality of fingers, the plurality of pad groups, and the plurality of busbars, and where at least some of the plurality of busbars on the front surface have orthographic projections on the front surface that are interleaved with orthographic projections, on the front surface, of the plurality of busbars on the rear surface.

In some embodiments, the substrate includes a front surface and a rear surface opposite to each other, and where the front surface is provided with the plurality of fingers, the plurality of pad groups, and the plurality of busbars, and the rear surface is provided with the plurality of fingers and the plurality of pad groups.

In some embodiments, the plurality of pad groups has a number being N, and the plurality of busbars has a number being n, wherein $N/4 \leq n < N$, and both n and N are positive integers.

In some embodiments, the plurality of pad groups has a number in a range of 15 to 22.

In some embodiments, the plurality of busbars has a number in a range of 4 to 11.

In some embodiments, the number of pads in the center region include two pads each closest to a respective one of the edge regions and having an orthographic projection with a first area on the substrate, the number of pads in the center region further include a pad farthest away from the edge regions and having an orthographic projection with a second area on the substrate, and the first area is greater than a second area.

In some embodiments, the substrate includes a front surface and a rear surface; where the plurality of fingers include: a plurality of first fingers arranged at intervals along the first direction and extending along the second direction, where the plurality of first fingers are disposed on the front surface and have a number in a range of 70 to 150; and a plurality of second fingers arranged at intervals along the first direction and extending along the second direction, where the plurality of second fingers are disposed on the rear surface and have a number in a range of 80 to 400; and where the plurality of pad groups include: a plurality of first pad groups arranged at intervals along the second direction and disposed on the front surface, where each of the plurality of first pad groups includes a plurality of first pads arranged at intervals along the first direction, and each of the plurality of first pads is connected to a respective one of the plurality of first fingers.

In some embodiments, each of the plurality of first fingers has a width in a range of 10 μm to 30 μm, and each of the plurality of second fingers has a width in a range of 15 μm to 50 μm.

In some embodiments, each of the plurality of first fingers has a height in a range of 6 μm to 30 μm, and each of the plurality of second fingers has a height in a range of 4 μm to 25 μm.

In some embodiments, the plurality of first pad groups have a number in a range of 12 to 26.

In some embodiments, the plurality of busbars include a plurality of first busbars arranged at intervals along the second direction and disposed on the front surface; and where the plurality of first busbars are connected to the plurality of first pad groups, and at least one of the plurality of first pad groups is disposed between two adjacent first busbars of the plurality of first busbars.

In some embodiments, the plurality of pad groups further include a plurality of second pad groups arranged at intervals along the second direction and disposed on the rear surface, where each of the plurality of second pad groups includes a plurality of second pads arranged at intervals along the first direction, each of the plurality of second pads is connected to a respective one of the plurality of second fingers, and each of the plurality of first pad groups has an orthographic projection on the front surface that is interleaved with an orthographic projection of any of the plurality of second pad groups on the front surface; and the plurality of busbars include a plurality of second busbars arranged at intervals along the second direction and disposed on the rear surface, where each of the plurality of second busbars are connected to a respective one of the plurality of second pad groups, and each of the plurality of first busbars has an orthographic projection on the front surface that is interleaved with an orthographic projection of any of the orthographic projection second busbars on the front surface.

Some embodiments in the present disclosure provide a photovoltaic module including: at least one cell string each formed by connecting a plurality of solar cells according to any one of the above embodiments; at least one welding strip each connected to two adjacent solar cells, where each of the at least one welding strip is connected to each of the plurality of pad groups in a respective one of the two adjacent solar cells; at least one encapsulation layer each covering a surface of the at least one cell string; and at least one cover plate each covering a surface of a respective encapsulation layer facing away from the at least one cell string.

In some embodiments, the plurality of solar cells in each of the at least one cell string are arranged at intervals along the first direction, and busbars in two adjacent solar cells in each of the at least one cell string are interleaved in the second direction.

BRIEF DESCRIPTION OF THE DRAWINGS

One or more embodiments are described by way of example with reference to the corresponding figures in the accompanying drawings, and the descriptions are not to be construed as limiting the embodiments. Unless otherwise particularly stated, the figures in the accompanying drawings are not drawn to scale. To describe the technical solutions in the embodiments of the present disclosure or the conventional technology more clearly, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DETAILED DESCRIPTION OF THE EMBODIMENTS

Figure 1:
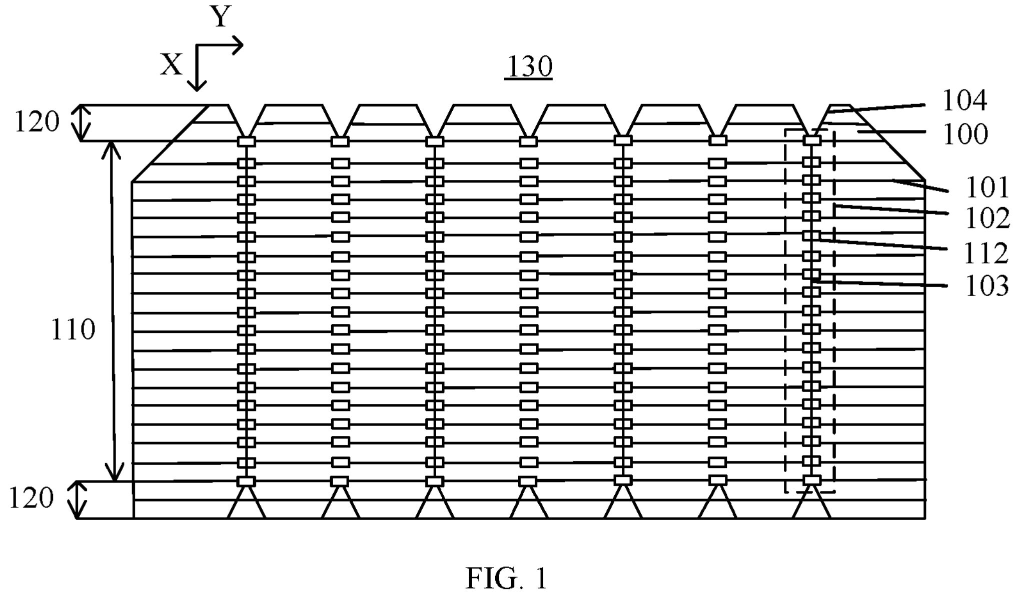
FIG. 1 is a schematic structural diagram of a front surface of a solar cell according to an embodiment of the present disclosure.

It can be seen from the Background that conventional solar cells are usually divided into two types. One type of solar cell has busbars. For this type of cell, a part of sunlight irradiated on a front surface of a substrate of the solar cell is blocked due to the busbars cover a portion of the front surface of the substrate, and the sunlight irradiated on the busbars cannot be converted into electrical energy, which degrades performance of the solar cell. The other type of solar cell is a cell without busbars. This type of cell has no busbar but only fingers, and has all busbars and pads excluded. Although this type of cell improves photovoltaic conversion efficiency, testing of efficiency of the cell is affected. All busbars and pads are excluded, and a testing probe can only be in contact with fingers. However, sizes of the fingers are small, so a very high demand for testing precision of the testing probe is required, and a testing value obtained through testing cannot represent a true level of the solar cell very well.

In the embodiments of the present disclosure, a plurality of pad groups are provided, and each pad group includes a plurality of pads, so that the busbars can be connected to the fingers through the pads, thereby improving reliability of the connection between the busbars and the fingers. In addition, a number of pads in a pad group that are located in a center region is equal to a number of fingers located in the center region, and the number of pads in the center region are respectively connected to the number of fingers in the center region (i.e., the number of pads in the center region and the number of fingers in the center region are connected to each other in a one-to-one correspondence), so that reliability of the connection between a busbar and each finger is improved when the busbar is connected to each finger. Moreover, two busbars are spaced apart from each other by at least one pad group, i.e., not all pad groups are connected to the busbars, but instead at least one pad group is not connected to the busbars. Compared with a conventional solution in which each pad group is connected to a busbar, the technical solution in the present disclosure can reduce the number of busbars. Compared with a solution in which busbars are provided, when current-voltage (IV) testing is performed on a cell without busbars, a testing probe can only be in contact with fingers, and testing precision is insufficient. Compared with the solution in which the cell has no busbar, busbars are locally provided in the technical solution in the present disclosure, so that the testing probe can be in contact with the busbars to improve accuracy of testing of the cell. In addition, communication of the entire solar cell can be realized via the busbars, so that photovoltaic conversion efficiency of the solar cell can be increased, and cell efficiency is increased by 0.01% to 0.015%.

The following describes the embodiments of the present disclosure in detail with reference to the accompanying drawings. However, a person of ordinary skill in the art may understand that, in the embodiments of the present disclosure, many technical details are provided to make readers better understand the present disclosure. However, the claimed technical solutions in the present disclosure can still be implemented even without these technical details and various changes and modifications based on the following embodiments.

Referring to FIG. 1, FIG. 1 is a schematic structural diagram of a front surface of a solar cell according to an embodiment of the present disclosure.

In some embodiments, the solar cell provided in the present disclosure includes a substrate 100. The substrate 100 includes a center region 110 and edge regions 120, and the edge regions 120 are respectively arranged on two opposing sides of the center region 110.

The solar cell further includes a plurality of fingers 101 arranged at intervals along the first direction X and extending along a second direction Y. The plurality of fingers 101 include a number of fingers 101 in the center region 110.

The solar cell further includes a plurality of pad groups 102 arranged at intervals along the second direction Y. Each pad group 102 includes a plurality of pads 112 arranged at intervals along the first direction X, and the plurality of pads 112 include a number of pads 112 in the center region 110 that are respectively connected to the number of fingers 101 in the center region 110. That is, the number of pads 112 in the center region 110 is equal to the number of fingers 101 in the center region 110, and the number of pads 112 in the center region 110 are connected to the number of fingers 101 in the center region 110 in a one-to-one correspondence.

The solar cell further includes a plurality of busbars 303 arranged at intervals along the second direction Y. Each busbar 103 is connected to a respective pad group 102 of some of the plurality of pad groups 102, and at least one pad group 102 is disposed between two adjacent busbars 103 of the plurality of busbars 103.

In the embodiments of the present disclosure, a plurality of pad groups 102 are provided, and each pad group 102 includes a plurality of pads 112, so that the busbars 103 can be connected to the fingers 101 through the pads 112, thereby improving reliability of the connection between the busbars 103 and the fingers 101. In addition, a number of pads 112 in a pad group 102 that are located in a center region 110 is equal to a number of fingers 101 located in the center region 110, and the pads 112 and the fingers 101 located in the center region 110 are connected to each other in a one-to-one correspondence, so that reliability of the connection between a busbar 103 and each finger 101 is improved when the busbar 103 is connected to each finger 101. Moreover, two busbars 103 are spaced apart from each other by at least one pad group 102, i.e., not all pad groups 102 are connected to the busbars 103, but instead at least one pad group 102 is not connected to the busbars 103. Compared with a conventional solution in which each pad group 102 is connected to a busbar 103, the technical solution in the present disclosure can reduce the number of busbars 103. Compared with a solution in which busbars are provided, when current-voltage (IV) testing is performed on a cell without busbars, a testing probe can only be in contact with fingers, and testing precision is insufficient. Compared with the solution in which the cell has no busbar, busbars 103 are locally provided in the technical solution in the present disclosure, so that the testing probe can be in contact with the busbars 103 to improve accuracy of testing of the cell. In addition, communication of the entire solar cell can be realized via the busbars, so that photovoltaic conversion efficiency of the solar cell can be increased, and cell efficiency is increased by 0.01% to 0.015%.

In some embodiments, the substrate 100 includes a front surface 130 and a rear surface 140 opposite to each other. In some embodiments, the solar cell is a single-sided cell, the front surface 130 of the substrate 100 serves as a light receiving surface for receiving incident light, and the rear surface 140 serves as a backlight surface. In some embodiments, the solar cell is a double-sided cell, both the front surface 130 and the rear surface 140 of the substrate 100 serve as light receiving surfaces for receiving incident light. It should be understood that the backlight surface in the present disclosure is also capable of receiving incident light, except that reception of incident light of the backlight surface is weaker than that of the light receiving surface, and is thus defined as the backlight surface.

Figure 2:
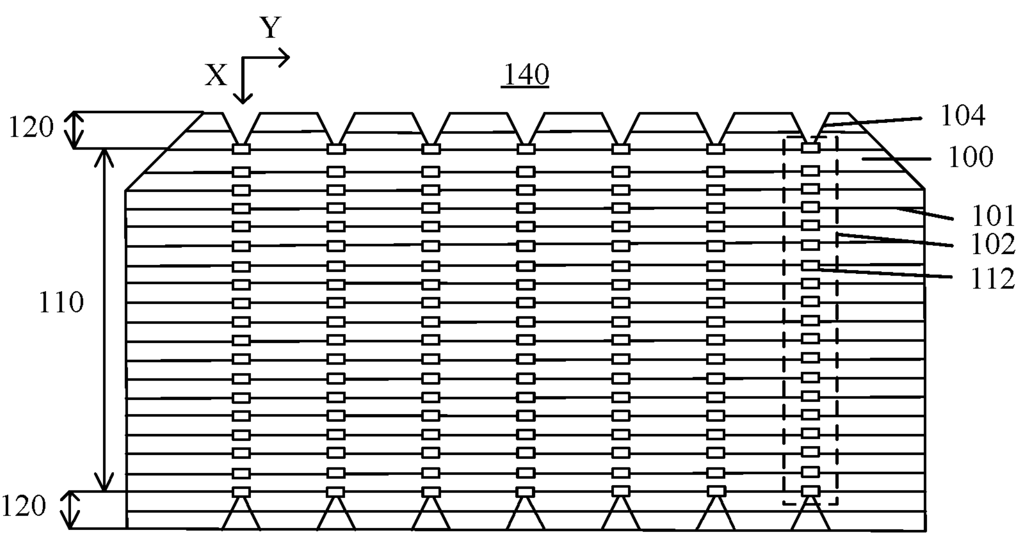
FIG. 2 is a schematic structural diagram of a rear surface of a solar cell according to an embodiment of the present disclosure.

Referring to FIG. 1 and FIG. 2, FIG. 2 is a schematic structural diagram of a rear surface of a solar cell according to an embodiment of the present disclosure.

In some embodiments, the front surface 130 is provided with fingers 101, pad groups 102 and busbars 103, and the rear surface 140 is provided with fingers 101 and pad groups 102. The fingers 101 and the pad groups 102 are disposed on both the front surface 130 and the rear surface 140. Through the fingers 101 disposed on both the front surface 130 and the rear surface 140, carriers in the substrate 100 of the solar cell are collected, so that these collected carriers can be converged and output conveniently. Through the pad groups 102 disposed on the front surface, connection between the pad groups 102 on the front surface 130 and the busbars 103 is facilitated. Through the pad groups 102 disposed on the rear surface 140, connection between the pad groups 102 and welding strips is facilitated in a subsequent process of preparing the photovoltaic module.

In some embodiments, no busbar is disposed on the rear surface of the solar cell.

Figure 3:
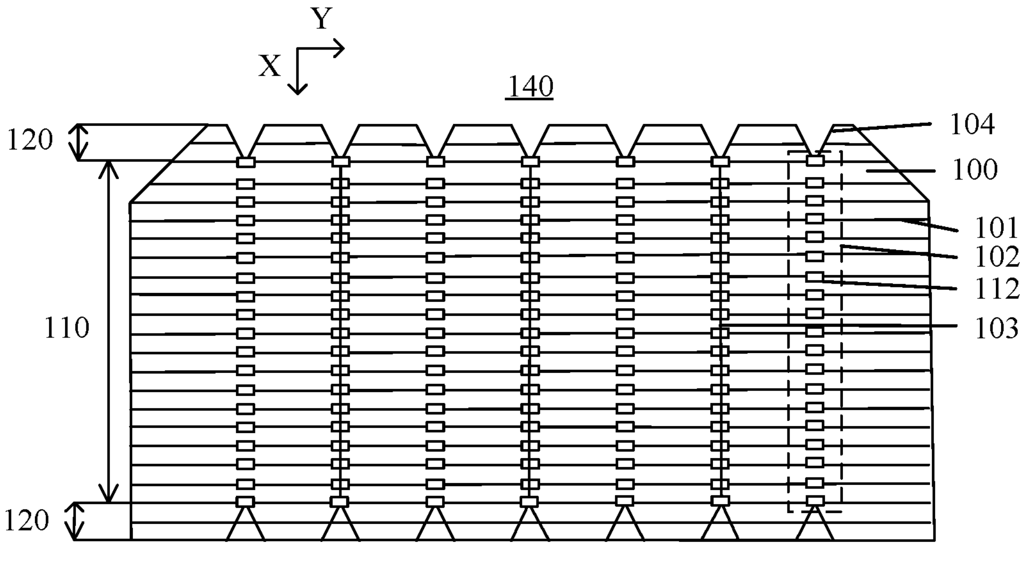
FIG. 3 is another schematic structural diagram of a rear surface of a solar cell according to an embodiment of the present disclosure.

Referring to FIG. 1 and FIG. 3, FIG. 3 is another schematic structural diagram of a rear surface of a solar cell according to an embodiment of the present disclosure.

In some embodiments, both the front surface 130 and the rear surface 140 are provided with the fingers 101, the pad groups 102, and the busbars 103, and at least one of busbars 103 on the front surface 130 has an orthographic projection on the front surface 130 that is interleaved with orthographic projections, on the front surface 130, of busbars 103 on the rear surface 140. It should be understood that if the busbars 103 on the front surface 130 completely coincide with the busbars 103 on the rear surface 140, the testing probe is always testing the same position for the front surface 130 and the rear surface 140 during testing, and testing is not precise enough. Through the arrangement in which at least one of busbars 103 on the front surface 130 have orthographic projections on the front surface 130 that are interleaved with orthographic projections, on the front surface 130, of busbars 103 on the rear surface 140, different point positions can be tested in the testing process, and testing precision is improved.

It should be noted that the interleaving means that orthographic projections, on the front surface 130, of busbars 103 on the front surface 130 and orthographic projections, on the front surface 130, of busbars 103 on the rear surface 140 are staggered or arranged at intervals.

In some embodiments, some of the busbars 103 on the front surface 130 have orthographic projections on the front surface 130 that are interleaved with orthographic projections, on the front surface 130, of busbars 103 on the rear surface 140. In some embodiments, each of the busbars 103 on the front surface 130 has an orthographic projection on the front surface 130 that is interleaved with an orthographic projection, on the front surface 130, of any of the busbars 103 on the rear surface 140. Compared with a case that some of the busbars 103 on the front surface 130 have orthographic projections on the front surface 130 that are interleaved with orthographic projections, on the front surface 130, of busbars 103 on the rear surface 140, the arrangement in which each of the busbars 103 on the front surface 130 has an orthographic projection on the front surface 130 that is interleaved with any of orthographic projections, on the front surface 130, of the busbars 103 on the rear surface 140 can further improve testing precision. For improvement of related testing precision, reference may be made to the above descriptions, and details are not described herein again.

In some embodiments, the pad groups 102 are disposed on only the front surface 130 of the substrate 100. If the busbars 103 are disposed on only the front surface 130 of the substrate 100, the pad groups 102 are arranged in collaboration with the busbars 103 to be disposed on only the front surface 130 of the substrate 100.

Still referring to FIG. 1, in some embodiments, the number of fingers 101 on the front surface 130 of the substrate 100 is in a range of 70 to 125, for example, 75, 80, 85, 90, 95, or 100, etc. It should be understood that a larger number of fingers 101 indicates a stronger capability of the solar cell to collect carriers. Similarly, a larger number of fingers 101 indicates a larger area of the blocked region (i.e., a region blocked by the fingers from the light) of the front surface 130 of the substrate 100. Therefore, by setting the number of fingers 101 on the front surface 130 of the substrate 100 to the range of 70 to 125, the capability of the solar cell to collect carriers and the area of the blocked region are balanced, thereby improving performance of the solar cell.

In some embodiments, the number of fingers 101 on the rear surface 140 of the substrate 100 is in a range of 88 to 400, for example, 100, 130, 170, 200, 240, 280, or 300, etc. For the rear surface of the substrate 100, it should be understood that a larger number of fingers 101 indicates a stronger capability of the solar cell to collect carriers. Similarly, a larger number of fingers 101 indicates more materials consumed by the fingers 101. Therefore, by setting the number of fingers 101 on the rear surface 140 of the substrate 100 to be in the range of 88 to 400, the capability of the solar cell to collect carriers and the costs required for preparing the solar cell are balanced.

In some embodiments, the number of fingers 101 on the front surface 130 of the substrate 100 is less than or equal to the number of fingers 101 on the rear surface 140 of the substrate 100. It should be understood that the rear surface 140 is typically a backlight surface relative to the front surface 130, and thus the rear surface 140 may be provided with a larger number of fingers so that the capability of the solar cell to collect carriers can be improved without affecting light absorption of the front surface.

In some embodiments, the number of fingers 101 on the front surface 130 of the substrate 100 is greater than the number of fingers 101 on the rear surface 140 of the substrate 100, which can be adjusted according to actual situations.

In some embodiments, each finger 101 on the front surface 130 of the substrate 100 has a width in a range of 11 μm to 15 μm, for example, 12 μm, 13 μm, 14 μm, or 15 μm, etc. It should be understood that a larger width of the finger 101 indicates a stronger capability of the solar cell to collect carriers. Similarly, a larger width of the finger 101 indicates a larger area of the blocked region of the front surface 130 of the substrate 100. Therefore, by setting the width of the finger 101 on the front surface 130 of the substrate 100 to be in the range of 11 μm to 15 μm, the capability of the solar cell to collect carriers and the area of the blocked region are balanced, thereby improving performance of the solar cell.

In some embodiments, each finger 101 on the rear surface 140 of the substrate 100 has a width in a range of 13 μm to 17 μm, for example, 14 μm, 15 μm, or 16 μm, etc. For the rear surface of the substrate 100, it should be understood that a larger width of the finger 101 indicates a stronger capability of the solar cell to collect carriers. Similarly, a larger width of the finger 101 indicates more materials consumed by the fingers 101. Therefore, by setting the width of the finger 101 on the rear surface 140 of the substrate 100 to be in the range of 13 μm to 17 μm, the capability of the solar cell to collect carriers and the cost required for preparing the solar cell are balanced.

In some embodiments, each finger 101 on the front surface 130 of the substrate 100 has a width that is less than or equal to a width of any of the fingers 101 on the rear surface 140 of the substrate 100. It should be understood that the rear surface 140 is typically a backlight surface relative to the front surface 130. Therefore, the finger with a large width may be provided on the rear surface 140, thereby improving the capability of the solar cell to collect carriers without affecting light absorption of the front surface of the solar cell.

In some embodiments, each finger 101 on the front surface 130 of the substrate 100 has height in a range of 18 μm to 22 μm, for example, 19 μm, 20 μm, or 21 μm, etc. It should be understood that for the finger 101, a larger height of the finger 101 indicates more convenient welding between the finger and the busbar 103 as well as more materials consumed by the finger. Therefore, by setting the height of the finger 101 on the front surface 130 of the substrate 100 to the range of 18 μm to 22 μm, both the difficulty of the preparation process of the solar cell and the cost of the solar cell are taken into account. Moreover, for a case that the solar cell receives sunlight, sunlight received by the solar cell everyday may not be vertically incident, and sunlight that is not vertically incident is inevitably affected by the height of the finger 101 and is partially blocked. In addition, a larger height of the finger 101 indicates more sunlight that may be blocked. Therefore, the area of the blocked region of the front surface 130 of the substrate 100 can be reduced by setting the height of the finger 101 on the front surface 130 of the substrate 100 to be in the range of 18 μm to 22 μm.

In some embodiments, each finger 101 on the rear surface 140 of the substrate 100 has a height in a range of 14 μm to 17 μm, for example, 15 μm or 16 μm, etc. For the finger 101 on the rear surface 140, a larger height of the finger 101 indicates more convenient welding between the finger 101 and the welding strip as well as more materials consumed by the finger. Therefore, by setting the height of the finger 101 on the rear surface 140 of the substrate 100 to be in the range of 14 μm to 17 μm, both the difficulty of the preparation process of the solar cell and the cost of the solar cell are taken into account.

In some embodiments, the number of the pad groups 102 is in a range of 15 to 22, for example, 16, 17, 18, 19, or 20, etc. For the pad groups 102, the larger the number of pad groups, the more convenient the connection between busbars 103 and fingers 101 on the front surface is, the more convenient the connection with the welding strips is for a solution in which the rear surface includes no busbar 103, and the more convenient the connection between busbars 103 and fingers 101 is for a solution in which the rear surface includes busbars 103. However, a larger number of pad groups 102 affect light absorption of the front surface 130 and consume more materials. By setting the number of pad groups 102 to be in the range of 15 to 22, the cost required for preparing the solar cell is reduced while facilitating the preparation process of the solar cell.

In some embodiments, the number of pad groups 102 refers to a number of pad groups on the front surface 130 of the substrate 100.

In some embodiments, the number of pad groups 102 on the rear surface 140 of the substrate 100 is the same as the number of pad groups 102 on the front surface 130 of the substrate 100, so that the pad groups 102 formed on the front surface 130 and the rear surface 140 of the substrate 100 can use the same template, to reduce complexity of the process for forming the solar cell.

In some embodiments, the number of busbars 103 on the front surface 130 of the substrate 100 is less than the number of pad groups 102 on the front surface 130 of the substrate 100. In this way, on the one hand, the number of busbars 103 is reduced to reduce the usage of paste, and on the other hand, the busbars 103 are reserved, which is conducive for the testing probe to testing the electrical performance of the solar cell.

Figure 4:
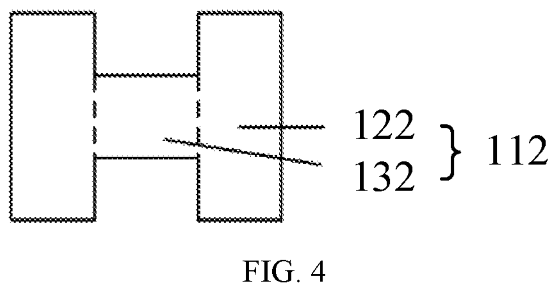
FIG. 4 is a schematic structural diagram of a pad in a solar cell according to an embodiment of the present disclosure.

Referring to FIG. 4, FIG. 4 is a schematic structural diagram of a pad according to an embodiment of the present disclosure.

In some embodiments, a pad 112 includes two opposing end portions 122 along a second direction Y and a body portion 132 connecting the two opposing end portions 122. A length of each of the two end portions 122 in a first direction X is greater than a length of the body portion 132 in the first direction X. A width of each of the two end portions 122 in the second direction Y is less than a width of the body portion 132 in the second direction Y.

It should be understood that the finger 101 needs to be in contact with the pad 112 in a printing process, but deviation may occur in the printing process. In this case, the pad 112 are provided with two end portions 122 each having a length larger than the body portion 132. In this way, even if deviation occurs during printing, the pad 112 is still in contact with the finger 101, thereby improving reliability of contact between the finger 101 and the pad 112. For the body portion 132, the body portion 132 needs to be welded to a busbar 103 or a welding strip. Similarly, deviation may also occur in a welding alignment process of the busbar 103 and the welding strip. Therefore, a larger width of the body portion 132 in the second direction Y can facilitate welding of the pad 112.

In some embodiments, the number of busbars 103 is in a range of 4 to 11, for example, 5, 6, 7, 8, 9, or 10. It should be understood that a larger number of busbars 103 indicates more accurate testing of the solar cell as well as more blocked light for the solar cell. Therefore, by setting the number of busbars 103 to be in the range of 4 to 11, accuracy of the testing of the solar cell can be improved and performance of the solar cell can also be improved.

In some embodiments, the number of busbars 103 refers to a number of pad groups on the front surface 130 of the substrate 100.

In some embodiments, the busbars 103 are disposed on only the front surface 130 of the substrate 100. By disposing the busbars 103 on only the front surface 130 of the substrate 100, testing of the solar cell is facilitated, and the busbars 103 are prevented from affecting light absorption of the rear surface of the solar cell, thereby facilitating testing of the solar cell while improving performance of the solar cell.

In some embodiments, any two adjacent busbars 103 are spaced apart from each other by at least one pad group 102. In a case that a size of the solar cell is fixed, through the arrangement in which any two adjacent busbars 103 are spaced apart from each other by at least one pad group 102, the number of busbars 103 can be limited, thereby improving performance of the solar cell while improving accuracy of the testing of the solar cell.

In some embodiments, some two adjacent busbars 103 are spaced apart from each other by one pad group 102, and some two adjacent busbars 103 are spaced apart from each other by a plurality of pad groups 102. For example, some two adjacent busbars 103 are spaced apart from each other by one pad group 102, and some two adjacent busbars 103 are spaced apart from each other by two pad groups 102. Similarly, in the case that the size of the solar cell is fixed, the number of busbars 103 can be limited, thereby improving performance of the solar cell while improving accuracy of the testing of the solar cell.

In some embodiments, any two adjacent busbars 103 are spaced apart from each other by the same number of pad groups 102. For example, any two adjacent busbars 103 may be spaced apart from each other by two or three pad groups 102. In some embodiments, pairs of busbars 103 may be spaced apart from each other by different numbers of pad groups 102. For example, some pairs of busbars 103 are spaced apart from each other by two pad groups 102, and some pairs of busbars 103 are spaced apart from each other by three pad groups 102.

In some embodiments, the busbars 103 arranged at intervals along the second direction Y are evenly arranged on a surface of the substrate 100. That is to say, the busbars 103 are not disposed on only one side of the surface of the substrate 100 in the second direction Y, but instead the busbars 103 are disposed on both sides of the surface of the substrate 100 in the second direction Y, so that performance of the solar cell on both sides in the second direction Y can be tested through the testing probe, and testing reliability can be further improved.

Figure 5:
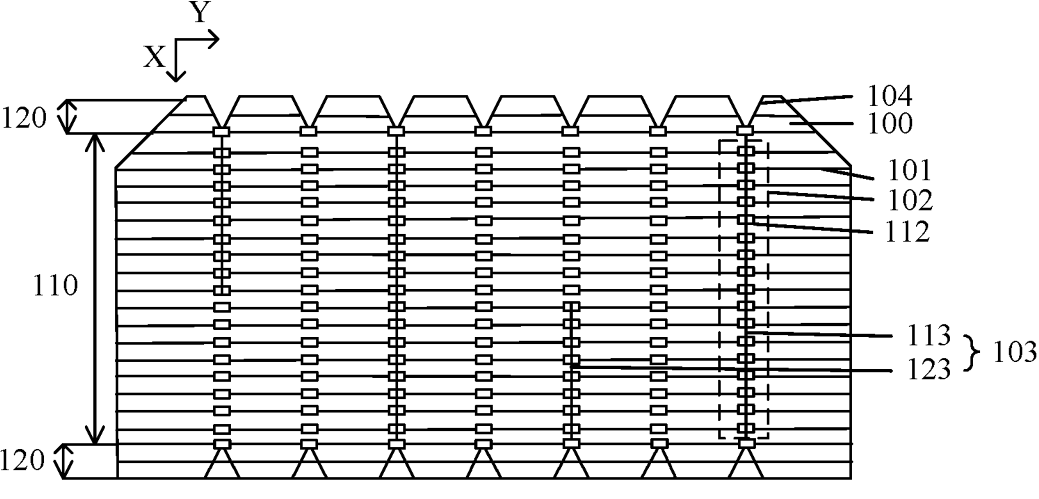
FIG. 5 is a schematic structural diagram of a solar cell according to an embodiment of the present disclosure.

Referring to FIG. 5, FIG. 5 is a schematic structural diagram of a solar cell according to an embodiment of the present disclosure.

In some embodiments, the busbars 103 include first busbars 113 and second busbars 123. Each first busbar 113 is connected to all pads 112 of a respective pad group 102, and each second busbar 123 is connected to some pads 112 of a respective pad group 102. In other words, lengths of the busbars 103 in the first direction X are different, all the fingers 101 can be connected by providing the first busbars 113, and light blocking of the busbars 103 can be reduced by providing the second busbars 123, thereby improving reliability of the solar cell.

In some embodiments, different second busbars 123 are staggered. For example, the number of fingers 101 is n, where n is a positive integer, and the n fingers 101 are divided into a $1^{st}$ finger to an $n^{th}$ finger along the first direction X. The number of second busbars 123 is N, where N is a positive integer, and the N second busbars 123 are divided into a $1^{st}$ busbar to an $N^{th}$ busbar along the second direction Y. The $1^{st}$ busbar is connected to the $1^{st}$ finger to the $(n/N)^{th}$ finger, the $2^{nd}$ busbar is connected to the $((n/N)+1)^{th}$ finger to the $(2n/N)^{th}$ finger, and so on.

In some embodiments, different second busbars 123 are staggered, and the different second busbars 123 are not connected to same fingers 101. Similar to the above exemplary description, the different second busbars 123 are sequentially connected to different fingers 101.

In some embodiments, different second busbars 123 are staggered, and the different second busbars 123 are not connected to same fingers 101. In addition, connections between the second busbars 123 arranged at intervals along the second direction Y and different fingers 101 are not sequentially arranged at intervals along the first direction X. For example, the number of fingers 101 is n, the n fingers 101 are divided into a $1^{st}$ finger to an $n^{th}$ finger along the first direction X, the number of second busbars 123 is N, and the N second busbars 123 are divided into a $1^{st}$ busbar to an $N^{th}$ busbar along the second direction Y. The $1^{st}$ busbar is connected to the $1^{st}$ finger to the $(n/N)^{th}$ finger, the $2^{nd}$ busbar is connected to the $((3n/N)+1)^{th}$ finger to the $(4n/N)^{th}$ finger, the $3^{rd}$ busbar is connected to the $((8n/N)+1)^{th}$ finger to the $(9n/N)^{th}$ finger, and so on. There is no pattern of arrangement between different second busbars 123.

It should be understood that the second busbars 123 with a certain regular arrangement, compared to the second busbars 123 that do not have a regular arrangement, can facilitate preparation of a screen printing plate, thereby facilitating preparation of the solar cell and improving aesthetics of the solar cell.

It should be noted that the foregoing relationship between n and N may be that n is an integer multiple of N. If no integer multiple relationship exists between n and N, n/N is rounded when a connection relationship between the second busbars 123 and the fingers 101 is set. The rounding herein means that a remainder part is rejected when a division operation is performed. For example, 8/3 is rounded to 2.

Figure 6:
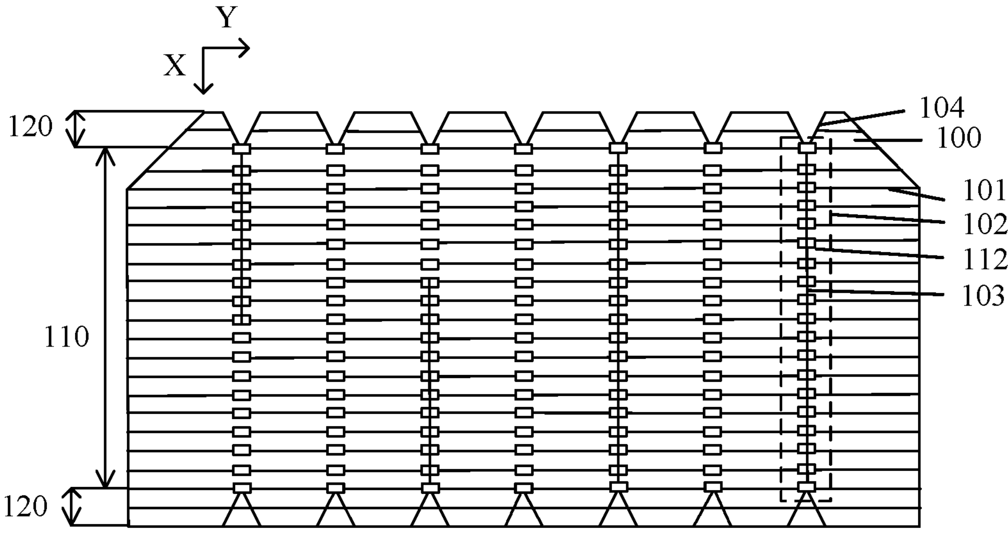
FIG. 6 is another schematic structural diagram of a solar cell according to an embodiment of the present disclosure.

Referring to FIG. 6, FIG. 6 is another schematic structural diagram of a solar cell according to an embodiment of the present disclosure.

In some embodiments, different second busbars 123 are further connected to same fingers 101. For example, the number of fingers 101 is 8, the fingers 101 arranged at intervals along the first direction X are divided into a $1^{st}$ finger to an $8^{th}$ finger, the number of second busbars 123 is 3, and the second busbars 123 arranged at intervals along the second direction Y are divided into a $1^{st}$ busbar to a $3^{rd}$ busbar. The $1^{st}$ busbar is connected to the $1^{st}$ finger to the $5^{th}$ finger, the $2^{nd}$ busbar is connected to the $3^{rd}$ finger to the $7^{th}$ finger, and the $3^{rd}$ busbar is connected to the $4^{th}$ finger to the $8^{th}$ finger.

It should be understood that since the different second busbars 123 are also connected to the same fingers 101, all fingers 101 are electrically connected via the plurality of different second busbars 123. In this way, performance of the solar cell can be equally well reflected by testing the second busbars 123.

It should be noted that the foregoing exemplary description is only illustrative description made for ease of facilitating understanding, but is not intended to limit the numbers and connection manners of the fingers 101 and the second busbars 123.

In some embodiments, different second busbars 123 have the same length. In some embodiments, different second busbars 123 have different lengths. Compared to the second busbars 123 with different lengths, all the second busbars 123 with the same length can facilitate preparation of a screen printing plate of the solar cell, thereby facilitating preparation of the solar cell and improving aesthetics of the solar cell.

In some embodiments, a first busbar 113 and a second busbar 123 that are adjacent to each other are spaced apart from each other by at least one pad group 102. It should be understood that for solar cells with the same size, if the number of pad groups 102 between the first busbar 113 and the second busbar 123 that are adjacent to each other is larger, the number of first busbars 113 and second busbars 123 is smaller due to an area limitation. In this way, light blocking of the busbars 103 for the solar cells can be reduced. Similarly, because of the first busbars 113 and the second busbars 123, testing of the solar cells can be facilitated.

In some embodiments, each of the first busbars 113 has a width in the second direction Y that is greater than a width of any of the second busbars 123 in the second direction Y. In this way, the first busbars 113 serve as the busbars with which the testing probe is mainly in contact. On the one hand, each first busbar 113 is connected to all pads 112 in a respective pad group 102, which further improves precision of the testing of the solar cell. On the other hand, the first busbar 113 has a larger width in the second direction Y, which facilitates contact between the testing probe and the first busbar 113, and therefore facilitates the testing.

In some embodiments, each busbar 103 is electrically connected to all pads 112 in a respective the pad group 102, or each busbar 103 is electrically connected to some pads 112 in a respective pad group 102. In other words, all the busbars 103 are each connected to all pads 112 in the respective pad group 102 or some pads 112 in the respective pad group 102.

If only busbars 103 each connected to some pads 112 in the respective pad group 102 are provided, the busbars 103 connected to only some pads 112 can also facilitate testing compared with the solar cell having no busbar, and a testing result is more accurate compared with the solar cell having no busbar. If only busbars 103 each electrically connected to all pads 112 in the respective pad group 102 are provided, accuracy of the testing result can be further improved.

Figure 7:
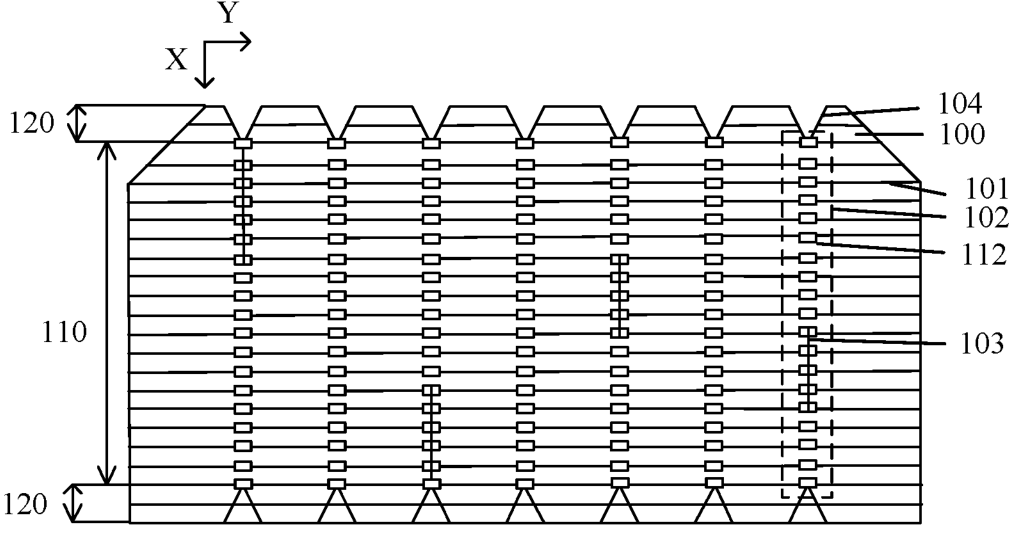
FIG. 7 is still another schematic structural diagram of a solar cell according to an embodiment of the present disclosure.

Referring to FIG. 7, FIG. 7 is still another schematic structural diagram of a solar cell according to an embodiment of the present disclosure, which shows a front surface or a rear surface of the solar cell.

In some embodiments, only busbars 103 each connected to some pads 112 in a respective pad group 102 are provided, and different busbars 103 are further connected to same fingers 101. In this way, all fingers 101 are electrically connected via a plurality of busbars 103. Therefore, when testing is performed, performance of the solar cell is well reflected, and paste is further reduced as much as possible, which further improves the performance of the solar cell.

Still referring to FIG. 1, in some embodiments, a number of the pad groups 102 is N, and a number of the busbars 103 is n, where $N/4 \leq n < N$, and both n and N are positive integers. Through setting a relationship between the number of busbars 103 and the number of pad groups to be $N/4 \leq n < N$, it can be understood that the number of busbars 103 is set to be less than the number of pad groups 102, so that there are at least two adjacent busbars 103 are spaced apart from each other by at least one pad group 102. The number of busbars 103 is set to be greater than or equal to a quarter of the number of pad groups 102, thereby avoiding a case that an excessively small number of busbars 103 causes insufficiently precise testing, and therefore improving reliability of the testing result.

In some embodiments, an area of an orthographic projection of a pad 112 in the center region 110 and closest to a respective one of the two opposing edge regions 120 on the substrate 100 is greater than an area of an orthographic projection of a pad 112 in the center region 110 and farthest away from the edge regions 120 on the substrate 100. It can be understood that in the solar cell, reliability of connection between the pad 112 and the busbar 103 at a portion of the solar cell that is closer to edges is lower. Therefore, through the arrangement in which the area of the orthographic projection of the pad 112 in the center region 110 and closest to the edge region 120 on the substrate 100 is greater than the area of the orthographic projection of the pad 112 in the center region 110 and farthest away from the edge regions 120 on the substrate 100, reliability of connection between the pad 112 and the busbar 103 is improved.

In some embodiments, in a direction of the edge region 120 towards the center region 110, areas of orthographic projections of the pads 112 on the substrate 100 are sequentially reduced. On the one hand, an increase in the area of the orthographic projection of the pad 112 at the edge on the surface of the substrate 100 improves reliability of connection between the pad group 102 and the busbar 103. On the other hand, the arrangement in which the area of the pad 112 located in the center is relatively small reduces the usage of the material, and controls the cost of the solar cell.

In some embodiments, the solar cell further includes electrodes 104 in the edge regions 120, and the electrodes 104 are connected to a plurality of fingers 101, and each electrode 104 is in the shape of Y. It can be understood that in a process of preparing the solar cell, the edge regions 120 may be blocked. Therefore, the finger 101 and the pad 112 may not be printed in the edge regions 120. The electrode 104 is arranged in the shape of Y to make the electrodes be in contact with the fingers 101 and the busbars 103, which can facilitate the preparation process of the solar cell.

Figure 8:
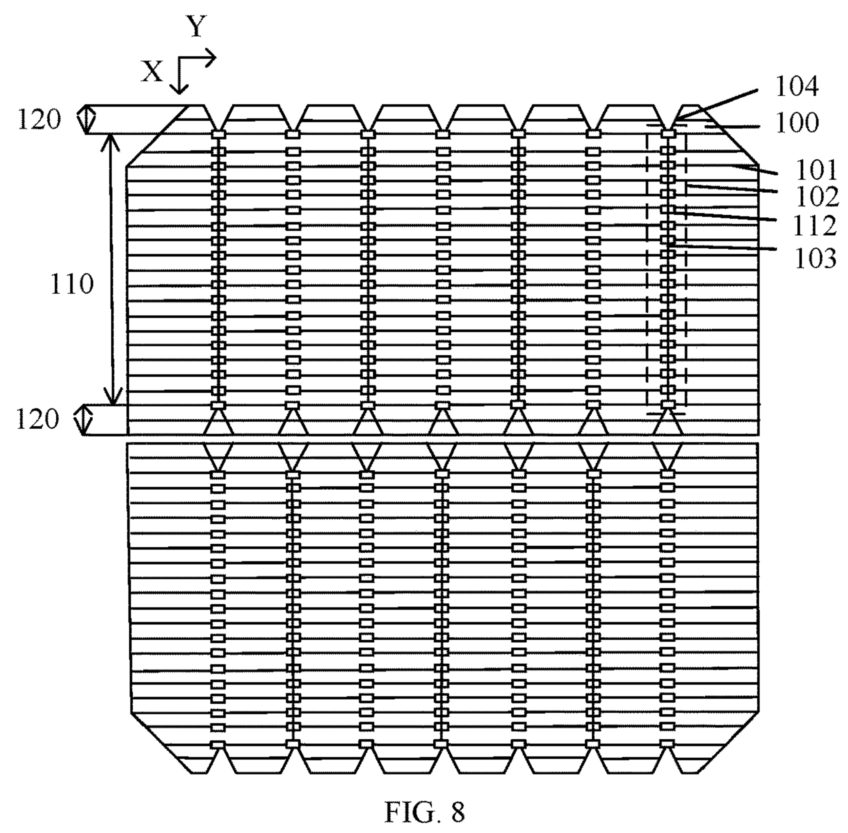
FIG. 8 is yet another schematic structural diagram of a solar cell according to an embodiment of the present disclosure.

Referring to FIG. 8, FIG. 8 is yet another schematic structural diagram of a solar cell according to an embodiment of the present disclosure.

In some embodiments, the solar cell includes two half-cut solar cells, and busbars 103 of the two half-cut solar cells are interleaved in the second direction Y. Through the arrangement in which the busbars 103 of the two half-cut solar cells are interleaved in the second direction Y, the testing probe can be in contact with busbars 103 at different positions for testing in a testing process, thereby improving reliability of the testing result.

In the embodiments of the present disclosure, a plurality of pad groups 102 are provided, and each pad group 102 includes a plurality of pads 112, so that the busbars 103 can be connected to the fingers 101 through the pads 112, thereby improving reliability of the connection between the busbars 103 and the fingers 101. In addition, a number of pads 112 in a pad group 102 that are located in a center region 110 is equal to a number of fingers 101 located in the center region 110, and the pads 112 and the fingers 101 located in the center region 110 are connected to each other in a one-to-one correspondence, so that reliability of the connection between a busbar 103 and each finger 101 is improved when the busbar 103 is connected to each finger 101. Moreover, two busbars 103 are spaced apart from each other by at least one pad group 102, i.e., not all pad groups 102 are connected to the busbars 103, but instead at least one pad group 102 is not connected to the busbars 103. Compared with a conventional solution in which each pad group 102 is connected to a busbar 103, the technical solution in the present disclosure can reduce the number of busbars 103. Compared with a solution in which busbars are provided, when current-voltage (IV) testing is performed on a cell without busbars, a testing probe can only be in contact with fingers, and testing precision is insufficient. Compared with the solution in which the cell has no busbar, busbars 103 are locally provided in the technical solution in the present disclosure, so that the testing probe can be in contact with the busbars 103 to improve accuracy of testing of the cell. In addition, communication of the entire solar cell can be realized via the busbars, so that photovoltaic conversion efficiency of the solar cell can be increased, and cell efficiency is increased by 0.01% to 0.015%.

Some embodiments of the present disclosure further provide a photovoltaic module. The photovoltaic module may include some embodiments of the solar cell as described above, or include all embodiments of the solar cell as described above. The photovoltaic module provided in the embodiments of the present disclosure is described below with reference to accompanying drawings. It should be noted that for parts the same as or corresponding to those in the foregoing embodiments, reference may be made to the corresponding description in the foregoing embodiments, and details are not described below.

Figure 9:
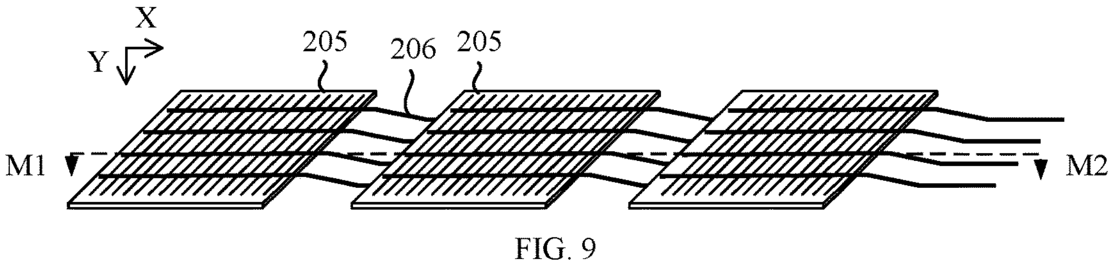
FIG. 9 is a schematic structural diagram of a photovoltaic module according to an embodiment of the present disclosure.
Figure 10:
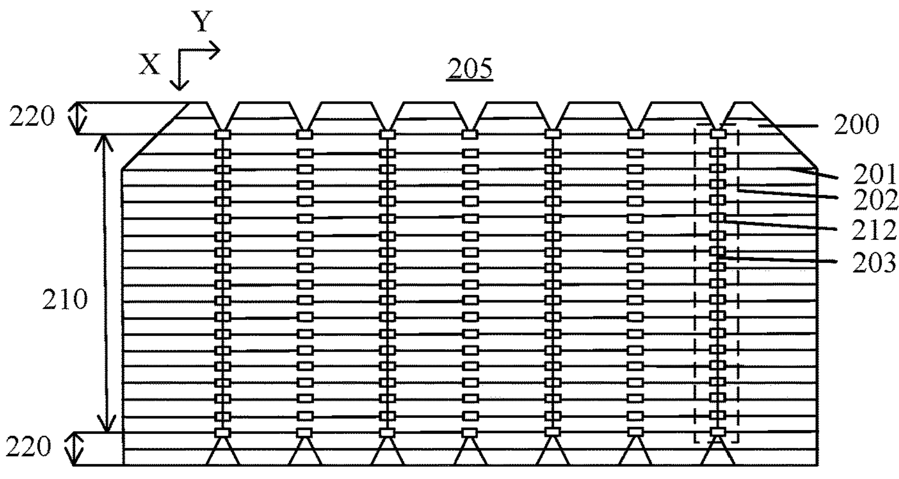
FIG. 10 is a schematic structural diagram of a solar cell in a photovoltaic module according to an embodiment of the present disclosure.
Figure 11:
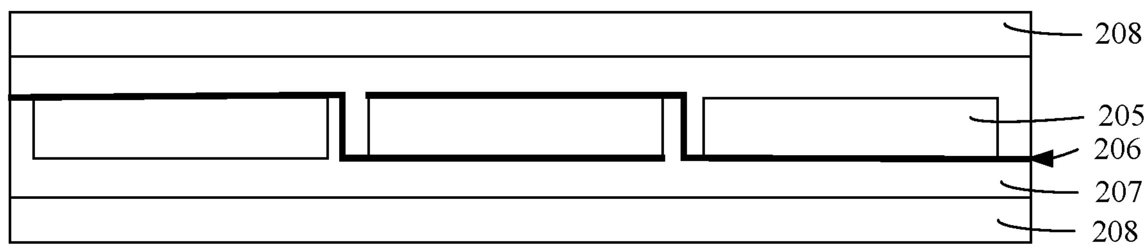
FIG. 11 is a cross-sectional view of a photovoltaic module according to an embodiment of the present disclosure.

Referring to FIG. 9 to FIG. 11, FIG. 9 is a schematic structural diagram of a photovoltaic module according to an embodiment of the present disclosure, FIG. 10 is a schematic structural diagram of a solar cell according to an embodiment of the present disclosure, and FIG. 11 is a cross-sectional view taken along line M1M2 in FIG. 9 according to an embodiment of the present disclosure.

In some embodiments, the photovoltaic module includes at least one cell string each formed by connecting a plurality of solar cells 205, and welding strips 206 each connecting two adjacent solar cells 205. Each of the plurality of solar cells 205 includes a substrate 200 including a center region 210 and edge regions 220, and the edge regions 220 are respectively arranged on two opposing sides of the center region 210, a plurality of fingers 201 arranged at intervals along a first direction X and extending along a second direction Y, a plurality of pad groups 202 arranged at intervals along the second direction Y, and a plurality of busbars 203 arranged at intervals along the second direction Y. The plurality of fingers 201 include a number of fingers in the center region 210. Each pad group 202 includes a plurality of pads 212 arranged at intervals along the first direction X, and the plurality of pads include a number of pads 212 in the center region 210 that are respectively connected to the number of fingers in the center region 110. Each busbar 203 is connected to a respective one of some of the plurality of pad groups 202, and at least one pad group 202 is disposed between two adjacent busbars 203. Each welding strip 206 is connected to each pad group 202 in a respective solar cell 205.

The photovoltaic module further includes at least one encapsulation layer 207 each covering a surface of the at least one cell string.

The photovoltaic module further includes at least one cover plate 208 each covering a surface of a respective encapsulation layer 207 facing away from the at least one cell string.

In the embodiments of the present disclosure, a plurality of pad groups 202 are provided, and each pad group 202 includes a plurality of pads 212, so that the busbars 203 can be connected to the fingers 201 through the pads 212, thereby improving reliability of the connection between the busbars 203 and the fingers 201. In addition, a number of pads 212 in a pad group 202 that are located in a center region 210 is equal to a number of fingers 201 located in the center region 210, and the pads 212 and the fingers 201 located in the center region 210 are connected to each other in a one-to-one correspondence, so that reliability of the connection between a busbar 203 and each finger 201 is improved when the busbar 203 is connected to each finger 201. Moreover, two busbars 203 are spaced apart from each other by at least one pad group 202, i.e., not all pad groups 202 are connected to the busbars 203, but instead at least one pad group 202 is not connected to the busbars 203. Compared with a conventional solution in which each pad group 202 is connected to a busbar 203, the technical solution in the present disclosure can reduce the number of busbars 203. Compared with a solution in which busbars are provided, when current-voltage (IV) testing is performed on a cell without busbars, a testing probe can only be in contact with fingers, and testing precision is insufficient. Compared with the solution in which the cell has no busbar, busbars 203 are locally provided in the technical solution in the present disclosure, so that the testing probe can be in contact with the busbars 203 to improve accuracy of testing of the cell. In addition, communication of the entire solar cell can be realized via the busbars, so that photovoltaic conversion efficiency of the solar cell can be increased.

In some embodiments, the solar cell includes but not limited to any one of a passivated emitter rear cell (PERC), a tunnel oxide passivated contact (TOPCon) cell, a heterojunction technology (HIT/HJT) cell, a perovskite cell, and a tandem cell. The tandem cell includes but not limited to a perovskite cell superimposed with a crystalline silicon cell, a perovskite cell superimposed with a perovskite cell, and a perovskite cell superimposed with a thin-film cell.

The solar cell may be a monocrystalline silicon solar cell, a polycrystalline silicon solar cell, an amorphous silicon solar cell, or a multi-compound solar cell, and the multi-compound solar cell includes a cadmium sulfide solar cell, a gallium arsenide solar cell, a copper indium selenide solar cell, or a perovskite solar cell. In addition, the solar cell may be a full cell or a cut cell, and the cut cell refers to a cell formed from one complete full cell through a cutting process.

In some embodiments, the encapsulation layer 207 includes a first encapsulation layer (not shown) and a second encapsulation layer (not shown). The first encapsulation layer covers one of a front surface or a rear surface of the solar cell, and the second encapsulation layer covers the other of the front surface or the rear surface of the solar cell. Specifically, at least one of the first encapsulation layer or the second encapsulation layer may be an organic encapsulation adhesive film such as a polyvinyl butyral (PVB) adhesive film, an ethylene-vinyl acetate copolymer (EVA) adhesive film, a polyolefin thermoplastic elastomer (POE) adhesive film, or a polyethylene glycol terephthalate (PET) adhesive film.

It should be understood that the first encapsulation layer and the second encapsulation layer have a parting line before a lamination process is performed. After the lamination process is performed, there is no concept of the first encapsulation layer and the second encapsulation layer in the formed photovoltaic module, that is, the first encapsulation layer and the second encapsulation layer have formed the integral encapsulation layer 207.

In some embodiments, the at least one cover plate 208 includes a cover plate with a light-transmitting function, such as a glass cover plate or a plastic cover plate. Specifically, a surface of each cover plate 208 facing the encapsulation layer 207 may be a concave-convex surface, thereby increasing the utilization rate of incident light. The at least one cover plate 208 includes a first cover plate and a second cover plate, the first cover plate is disposed on the first encapsulation layer, and the second cover plate is disposed on the second encapsulation layer.

In some embodiments, the solar cells 205 in the cell string are arranged along the first direction X, and busbars of two adjacent solar cells 205 in the cell string are interleaved with each other in the second direction Y. For the photovoltaic module, through the arrangement in which the busbars of two adjacent solar cells 205 in the cell string are interleaved with each other in the second direction Y, different potentials of the photovoltaic module can be tested, thereby improving reliability of the testing result.

Some embodiments of the present disclosure further provide a solar cell, which is conducive to controlling the cost of the solar cell and improving performance of the solar cell. In the solar cell provided in the embodiments of the present disclosure, a substrate is provided for collecting light and generating photo-generated carriers. First fingers are disposed on a front surface and have a number in a range of 70 to 150. A larger number of first fingers indicates a stronger capability of collecting carriers. However, the larger number of first fingers also indicates a stronger light blocking effect on the front surface of the solar cell, which reduces luminous flux irradiated on the surface of the substrate and reduces photo-generated carriers generated by the substrate. Therefore, the number of first fingers is set to be in the range of 70 to 150 to make the solar cell have a specific capability of collecting carriers, and reduce the light blocking effect of the first fingers on the surface of the substrate. Second fingers are disposed on a rear surface and have a number is in a range of 80 to 400. A larger number of second fingers indicates a stronger capability of collecting carriers. However, a larger number of second fingers indicates more consumed materials and higher costs. Therefore, the number of second fingers is set to be in the range of 80 to 400 to reduce costs of the solar cell while making the solar cell have a specific capability of collecting carriers. First pad groups are disposed on the front surface, and each first pad group includes a plurality of first pads, so that the first pads are connected to the first fingers to facilitate connection between the first fingers and busbars or welding strips.

Figure 12:
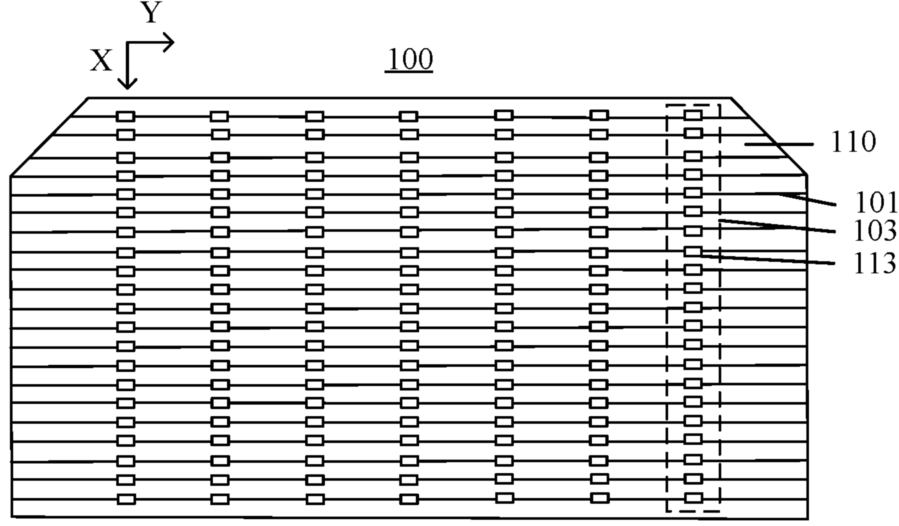
FIG. 12 is another schematic structural diagram of a front surface of a solar cell according to an embodiment of the present disclosure.
Figure 13:
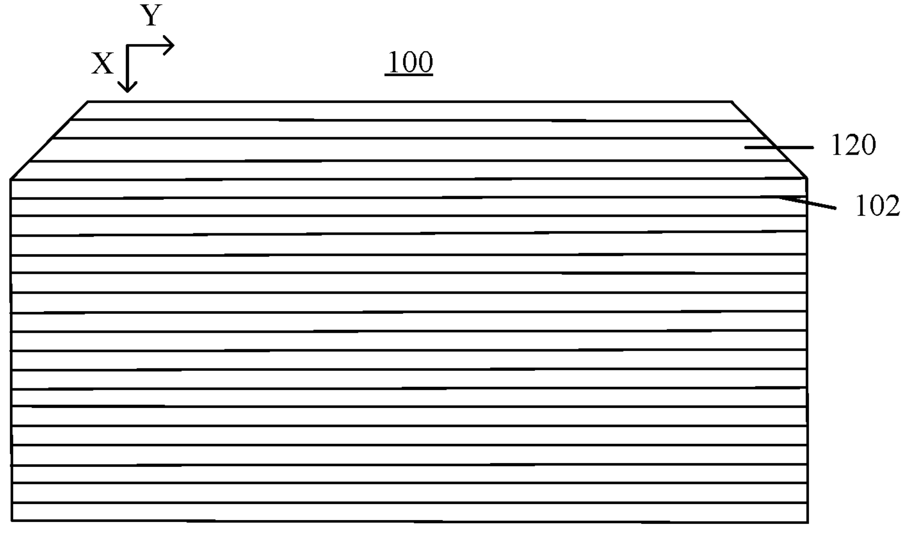
FIG. 13 is still another schematic structural diagram of a rear surface of a solar cell according to an embodiment of the present disclosure.

Referring to FIG. 12 and FIG. 13, FIG. 12 is a schematic structural diagram of a front surface of a solar cell according to an embodiment of the present disclosure, and FIG. 13 is a schematic structural diagram of a rear surface of a solar cell according to an embodiment of the present disclosure.

In some embodiments, the solar cell includes a substrate 300, and the substrate 300 includes a front surface 310 and a rear surface 320.

The solar cell further includes a plurality of first fingers 301 arranged at intervals along a first direction X and extending along a second direction Y, the first fingers 301 are disposed on the front surface 310, and a number of the first fingers 301 is in a range of 70 to 150.

The solar cell further includes a plurality of second fingers 302 arranged at intervals along the first direction X and extending along the second direction Y, the second fingers 302 are disposed on the rear surface 320, and a number of the second fingers 302 is in a range of 80 to 400.

The solar cell further includes a plurality of first pad groups 303 arranged at intervals along the second direction Y. The first pad groups 303 are disposed on the front surface 310, each first pad group 303 includes a plurality of first pads 313 arranged at intervals along the first direction X, and each first pad 313 is connected to a respective one of the first fingers 301.

In the embodiments of the present disclosure, the substrate 300 is provided for collecting light and generating photo-generated carriers. First fingers 301 are disposed on a front surface 310 and have a number in a range of 70 to 150. A larger number of first fingers 301 indicates a stronger capability of collecting carriers. However, the larger number of first fingers 301 also indicates a stronger light blocking effect on the front surface 310 of the solar cell, which reduces luminous flux irradiated on the surface of the substrate 300 and reduces photo-generated carriers generated by the substrate 300. Therefore, the number of first fingers 301 is set to be in the range of 70 to 150 to make the solar cell have a specific capability of collecting carriers, and reduce the light blocking effect of the first fingers 301 on the surface of the substrate 300. Second fingers 302 are disposed on a rear surface 320 and have a number is in a range of 80 to 400. A larger number of second fingers 302 indicates a stronger capability of collecting carriers. However, a larger number of second fingers 302 indicates more consumed materials and higher costs. Therefore, the number of second fingers 302 is set to be in the range of 80 to 400 to reduce costs of the solar cell while making the solar cell have a specific capability of collecting carriers. First pad groups 303 are disposed on the front surface 310, and each first pad group 303 includes a plurality of first pads 313, so that the first pads 313 are connected to the first fingers 301 to facilitate connection between the first fingers 301 and busbars or welding strips.

In some embodiments, the solar cell is a single-sided cell, the front surface 310 of the substrate 300 serves as a light receiving surface for receiving incident light, and the rear surface 320 serves as a backlight surface. In some embodiments, the solar cell is a double-sided cell, both the front surface 310 and the rear surface 320 of the substrate 300 serve as light receiving surfaces for receiving incident light. It should be understood that the backlight surface in the present disclosure is also capable of receiving incident light, except that reception of incident light of the backlight surface is weaker than that of the light receiving surface, and is thus defined as the backlight surface.

In some embodiments, the number of first fingers 301 is in a range of 70 to 100, for example, 77, 83, 89, or 95, etc. It should be understood that compared with the number of first fingers 301 in the range of 70 to 150, the number of first fingers 301 is set to be in the range of 70 to 100 further reduces light blocking on the surface of the solar cell, and does not excessively affect the capability of the first fingers 301 to collect photo-generated carriers.

In some embodiments, the number of first fingers 301 is in a range of 70 to 85, for example, 71, 75, 79, or 83, etc. It should be understood that if the number of first fingers 301 exceeds 85, the capability of the first fingers 301 to collect carriers is not improved as expected. For example, a total capability of the first fingers 301 to collect carriers is 1 when the number of first fingers 301 is in a range of 70 to 85, a total capability of the first fingers 301 to collect carriers is 1.3 when the number of first fingers 301 is in a range of 85 to 100, and a total capability of the first fingers 301 to collect carriers is 1.4 when the number of first fingers 301 is in a range of 300 to 150. That is to say, as the number of first fingers 301 is increased, a proportion of the increase of the total capability of the first fingers 301 to collect carriers decreases, but as the number of first fingers 301 is increased, the light blocking area of the first fingers 301 is continuously increased. Therefore, the number of first fingers 301 is set to be in the range of 70 to 85, which does not excessively affect the capability of the first fingers 301 to collect photo-generated carriers while further reducing light blocking on the surface of the solar cell.

In other words, as the number of first fingers 301 is increased, the light blocking area of the first fingers 301 is directly proportional to the number of first fingers 301. That is to say, the larger the number of first fingers 301, the larger the light blocking area of the first fingers 301 is. A total capability of the first fingers 301 to collect carriers is positively related to an increase in the number of first fingers 301, and as the number of first fingers 301 is increased, a total capability of the first fingers 301 to collect carriers and a slope of a curve of the number of first fingers 301 are gradually decreased. That is to say, after the number of first fingers 301 is increased to a specific extent, a negative effect caused by the increase of first fingers 301 is greater than a positive effect caused by the increase of first fingers 301, and therefore the number of first fingers 301 can be set to be in the range of 70 to 85.

It should be noted that a total capability of the first fingers 301 to collect carriers means that a sum of photo-generated carriers collected by all the first fingers 301 in a unit time.

In some embodiments, a width of each first finger 301 is in a range of 10 μm to 30 μm, for example, 11.5 μm, 15 μm, 18 μm, 21 μm, or 27 μm, etc. It should be understood that a larger width of the first finger 301 indicates a stronger capability of the solar cell to collect carriers. Similarly, a larger width of the first finger 301 indicates a larger area of the blocked region of the front surface 310 of the substrate 300. Therefore, the width of the first finger 301 on the front surface 310 of the substrate 300 is set to be in the range of 10 μm to 30 μm, so that the capability of the solar cell to collect carriers and the area of the blocked region of the surface of the solar cell are balanced, thereby improving performance of the solar cell.

In some embodiments, the width of the first finger 301 is in a range of 11 μm to 15 μm, for example, 12 μm, 13 μm, or 14 μm, etc. For the first finger 301, the width of the first finger 301 is directly proportional to the cost of the first finger 301, and a total capability of the first fingers 301 to collect carriers and a slope of a curve of the width of the first finger 301 are gradually decreased. Therefore, if the width of the first finger 301 is set to be in the range of 11 μm to 15 μm, the capability of the first fingers 301 to collect carriers can be utilized to a maximum extent.

In some embodiments, a height of each first finger 301 is in a range of 6 μm to 30 μm, for example, 7 μm, 11 μm, 15 μm, 17 μm, 20 μm, or 25 μm, or in a range of 7 to 20 μm, or in a range of 8 to 16 μm. It should be understood that for the first finger 301, a larger height of the first finger 301 indicates more convenient welding between the first finger 301 and the busbar or the welding strip, and a higher first finger 301 indicates more materials consumed by the first finger 301. Therefore, by setting the height of the first finger 301 on the front surface 310 of the substrate 300 to be in the range of 6 μm to 30 μm, both the difficulty of the preparation process of the solar cell and the cost of the solar cell are taken into account. Moreover, for a case that the solar cell receives sunlight, sunlight received by the solar cell everyday may not be vertically incident, and sunlight that is not vertically incident is inevitably affected by the height of the first finger 301 and is partially blocked. In addition, a larger height of the first finger 301 indicates more sunlight that may be blocked. Therefore, the area of the blocked region of the front surface 310 of the substrate 300 can be reduced by setting the height of the first finger 301 on the front surface 310 of the substrate 300 to be in the range of 6 μm to 30 μm.

In some embodiments, the height of the first finger 301 is in a range of 7 μm to 25 μm, for example, 8 μm, 10 μm, 12 μm, 15 μm, 18 μm, 22 μm, or 25 μm, or is in a range of 8 to 20 μm, or is in a range of 9 to 16 μm. For the first finger 301, the height of the first finger 301 is directly proportional to the cost of the first finger 301, and a capability of the first finger 301 to facilitate welding and a slope of a curve of the height of the first finger 301 are gradually reduced. Therefore, if the height of the first finger 301 is set to be in the range of 7 μm to 25 μm, the capability of the first finger 301 to facilitate welding can be utilized to a maximum extent.

In some embodiments, the number of second fingers 302 is in a range of 85 to 200, for example, 100, 120, 150, or 180, etc. For the second fingers 302, it should be understood that a larger number of second fingers 302 indicates a stronger capability of the solar cell to collect carriers. Similarly, a larger number of second fingers 302 indicates more materials consumed by the second fingers 302. Therefore, the cost required for preparing the solar cell is controlled while enhancing the capability of the solar cell to collect carriers by setting the number of second fingers 302 to be in the range of 85 to 200.

In some embodiments, the number of second fingers 302 is in a range of 100 to 200. It should be understood that for the second fingers 302, the number of second fingers 302 is directly proportional to the cost of the second fingers 302, but a total capability of the second fingers 302 to collect carriers and a slope of a curve of the number of second fingers 302 are gradually reduced. That is to say, after the number of second fingers 302 is increased to a specific extent, a negative effect caused by the increase of second fingers 302 is greater than a positive effect caused by the increase of second fingers 302.

In some embodiments, the width of the second finger 302 is in a range of 15 μm to 50 μm, for example, 16 μm, 21 μm, 25 μm, 28 μm, 35 μm, 43 μm, or 47 μm, etc. For the rear surface 320 of the substrate 300, it should be understood that a larger width of the second finger 302 indicates a stronger capability of the solar cell to collect carriers. Similarly, a larger width of the second finger 302 indicates more materials consumed by the second fingers 302. Therefore, the capability of the solar cell to collect carriers and the costs required for preparing the solar cell can be balanced by setting the width of the second finger 302 on the rear surface 320 of the substrate 300 to be in the range of 15 μm to 50 μm.

In some embodiments, the width of the second finger 302 is in a range of 16 μm to 27 μm, for example, 18 μm, 21 μm, or 26 μm, etc. For the second fingers 302, the width of the second finger 302 is directly proportional to the cost of the second fingers 302, and a total capability of the second fingers 302 to collect carriers and a slope of a curve of the costs of the second fingers 302 are gradually reduced. Therefore, if the width of the second finger 302 is set to be in the range of 16 μm to 27 μm, the capability of the second fingers 302 to collect carriers can be utilized to a maximum extent.

In some embodiments, the height of the second finger 302 is in a range of 4 μm to 25 μm, for example, 5 μm, 8 μm, 11 μm, 14 μm, 16 μm, 18 μm, or 22 μm, or is in a range of 6 to 18 μm. For the second finger 302, a larger height of the second finger 302 indicates more convenient welding between the second finger 302 and the welding strip, and a higher second finger 302 indicates more materials consumed by the second finger 302. Therefore, by setting the height of the second finger 302 on the rear surface 320 of the substrate 100 to be in the range of 4 μm to 25 μm, both the difficulty of the preparation process of the solar cell and the cost of the solar cell are taken in to account.

In some embodiments, the height of the second finger 302 is in a range of 6 μm to 15 μm, for example, 8 μm, 10 μm, 12 μm, or 13 μm, or is in a range of 9 to 12 μm. For the second finger 302, the height of the second finger 302 is directly proportional to the cost of the second finger 302, and a capability of the second finger 302 to facilitate welding and a slope of a curve of the height of the second finger 302 are gradually reduced. Therefore, if the height of the second finger 302 is set to be in the range of 6 to 15 μm, the capability of the second finger 302 to facilitate welding can be utilized to a maximum extent.

In some embodiments, the height of the second finger 302 is inversely proportional to the number of second fingers 302. That is to say, a larger number of second fingers 302 indicates that the height of the second finger 302 can be smaller, and a smaller number of second fingers 302 indicates that the height of the second finger 302 can be larger, so that a total usage of materials of the second fingers 302 can be controlled, thereby controlling the cost of the solar cell.

In some embodiments, the width of the second finger 302 is inversely proportional to the number of second fingers 302. That is to say, a larger number of second fingers 302 indicates that the width of the second finger 302 can be smaller, and a smaller number of second fingers 302 indicates that the width of the second finger 302 can be larger, so that a total usage of materials of the second fingers 302 can be controlled, thereby controlling the cost of the solar cell.

In some embodiments, a number of the first pad groups 303 is in a range of 12 to 26, for example, 13, 17, 20, 23, or 25, etc. For the first pad groups 303, a larger number of first pad groups 303 better facilitates subsequent connection between welding strips or busbars and first fingers 301 on the front surface 310, facilitates connection to welding strips for a solution in which the rear surface 320 has no busbar, and facilitates connection between busbars and first fingers 301 for a solution in which the rear surface 320 has busbars. However, a larger number of first pad groups 303 affect light absorption of the front surface 310 and consume more materials. By setting the number of first pad groups 303 to be in the range of 12 to 26, the cost required for preparing the solar cell is reduced while facilitating the preparation process of the solar cell.

In some embodiments, the number of first pad groups 303 is in a range of 15 to 22. By setting the number of first pad groups 303 to be in the range of 15 to 22, the cost for preparing the solar cell is reduced while further reducing the difficulty of the preparation process of the solar cell.

Figure 14:
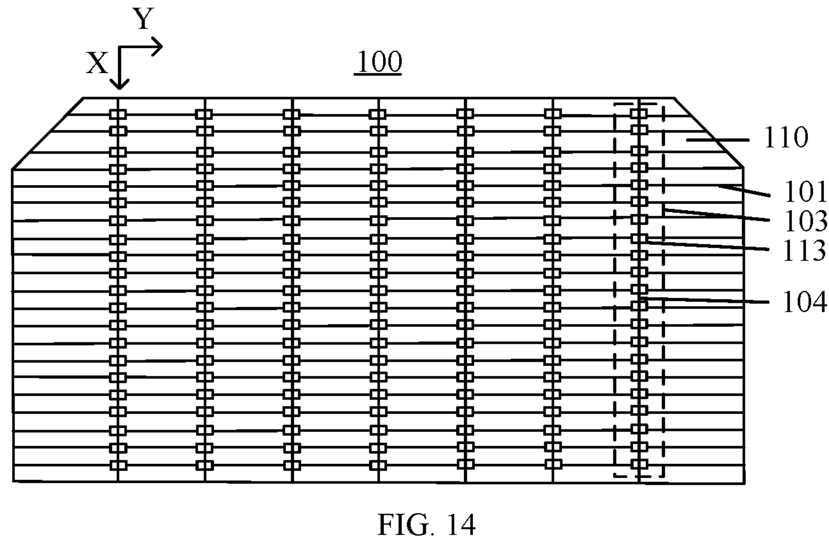
FIG. 14 is still another schematic structural diagram of a front surface of a solar cell according to an embodiment of the present disclosure.

Referring to FIG. 14, FIG. 14 is another schematic structural diagram of a front surface of a solar cell according to an embodiment of the present disclosure.

In some embodiments, the solar cell further includes a plurality of first busbars 104 arranged at intervals along the second direction Y. The first busbars 104 are disposed on the front surface 310, and the first busbars 104 are connected to the first pad groups 303. By providing a plurality of first busbars 104, photo-generated carriers collected on the first fingers 301 can be converged, and output of the photo-generated carriers is facilitated.

In some embodiments, the number of first busbars 104 is the same as the number of first pad groups 303, and each first busbar 104 is connected to a respective first pad group 303. In other words, each first pad group 303 is connected to a corresponding first busbar, thereby further improving a rate of collecting carriers of the solar cell.

Figure 15:
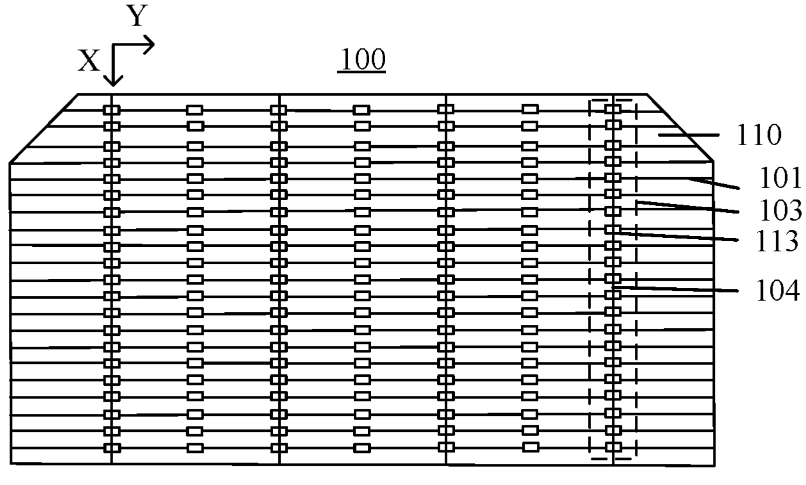
FIG. 15 is yet another schematic structural diagram of a front surface of a solar cell according to an embodiment of the present disclosure.

Referring to FIG. 15, FIG. 15 is still another schematic structural diagram of a front surface of a solar cell according to an embodiment of the present disclosure.

In some embodiments, at least two adjacent first busbars 104 are spaced apart from each other by at least one first pad group 303. In other words, the number of first pad groups 303 is less than the number of first busbars 104. It should be understood that a larger number of first busbars 104 indicates a higher rate of collecting carriers, but more first busbars 104 indicate a larger area of the blocked region of the front surface 310 of the substrate 100, which reduces a rate at which the substrate 300 generates photo-generated carriers.

In some embodiments, the number of first busbars 104 is in a range of 4 to 11. It should be understood that a larger number of first busbars 104 indicates more accurate testing of the solar cell, but a larger number of first busbars 104 indicates more blocked light for the solar cell and more used paste. Therefore, by setting the number of first busbars 104 to be in the range of 4 to 11, on the one hand, accuracy of the testing of the solar cell can be improved, and on the other hand, performance of the solar cell is improved and the cost of the solar cell is further reduced.

Figure 16:
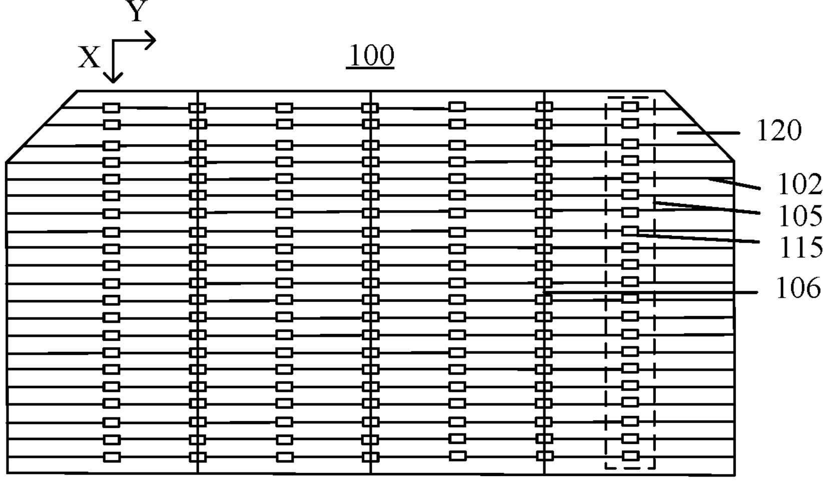
FIG. 16 is yet another schematic structural diagram of a rear surface of a solar cell according to an embodiment of the present disclosure.

Referring to FIG. 15 and FIG. 16, FIG. 16 is another schematic structural diagram of a rear surface of a solar cell according to an embodiment of the present disclosure.

In some embodiments, the solar cell further includes a plurality of second pad groups 105 arranged at intervals along the second direction Y and disposed on the rear surface 320, and a plurality of second busbars 106 arranged at intervals along the second direction Y and disposed on the rear surface 320. Each second pad group 105 includes a plurality of second pads 115 arranged at intervals along the first direction X, each second pad 115 is connected to a respective second finger 302, and orthographic projections of the first pad groups 303 on the front surface 310 are interleaved with orthographic projections of the second pad groups 105 on the front surface 310. The second busbars 106 are connected to the second pad groups 105, and orthographic projections of the first busbars 104 on the front surface 310 are interleaved with orthographic projections of the second busbars 106 on the front surface 310.

The arrangement in which the second pad groups 105 are disposed on the rear surface 320 can facilitate connection between the second busbar 106 and the second pad group 105 on the rear surface and can facilitate connection to the welding strip in a process of forming solar cells into a photovoltaic module. By providing the second busbars 106, the capability of the solar cell to collect carriers can be further increased. Through the arrangement in which orthographic projections of the first busbars 104 on the front surface 310 are interleaved with orthographic projections of the second busbars 106 on the front surface 310, testing precision can be improved.

It should be understood that if the orthographic projections of the first busbars 104 on the front surface 310 completely coincide with the orthographic projections of the second busbars 106 on the front surface 310, the testing probe is always testing the same position for the front surface 310 and the rear surface 320 during testing, and testing is not precise enough. Through the arrangement in which orthographic projections of the first busbars 104 on the front surface 310 are interleaved with orthographic projections of the second busbars 106 on the front surface 310, different point positions can be tested in a testing process, and testing precision can be improved.

In some embodiments, the number of second busbars 106 is the same as the number of second pad groups 105, and each second busbar 106 is connected to a respective second pad group 105. In other words, each second pad group 105 is connected to a corresponding second busbar 106, thereby further improving a rate of collecting carriers of the solar cell.

Figure 17:
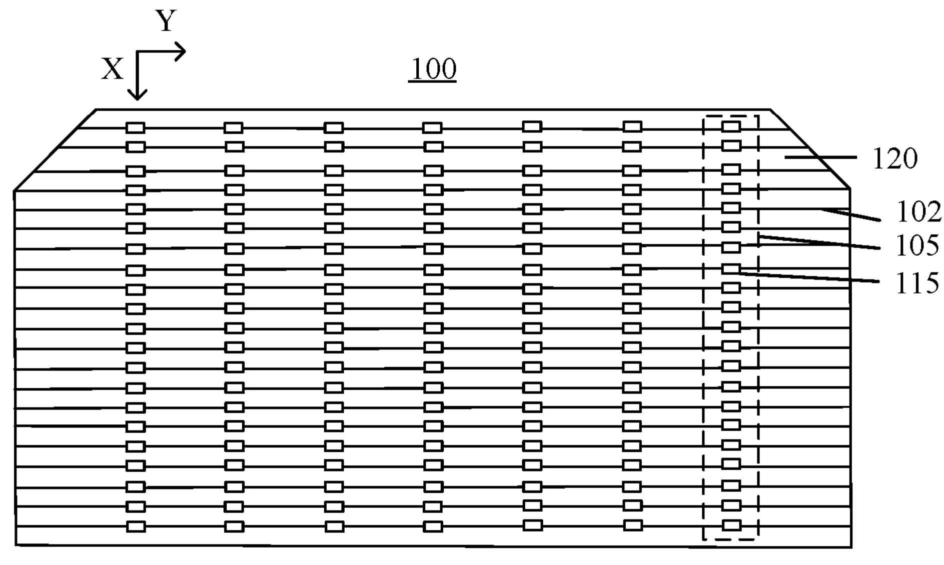
FIG. 17 is still yet another schematic structural diagram of a rear surface of a solar cell according to an embodiment of the present disclosure.

Referring to FIG. 17, FIG. 17 is still another schematic structural diagram of a rear surface of a solar cell according to an embodiment of the present disclosure.

In some embodiments, the solar cell further includes a plurality of second pad groups 105 arranged at intervals along the second direction Y and disposed on the rear surface 320, each second pad group 105 includes a plurality of second pads 115 arranged at intervals along the first direction X, and each second pad 115 is connected to a respective second finger 302. There is no busbar on the front surface 310 and the rear surface 320. In other words, a solar cell having no busbar is provided. Because the busbars cover a part of the solar cell, to block a part of sunlight, and sunlight irradiated onto the busbar cannot be converted into electrical energy, performance of the solar cell is degraded. The solar cell having no busbar can improve performance of the solar cell, and the first pad groups 303 and the second pad groups 105 are provided to facilitate connection between the solar cell and the welding strip.

In some embodiments, the solar cell may be a full cell, a half-cut cell, a third-cut cell, or the like. The full cell means that a cell is formed by a complete substrate, the half-cut cell means that a complete substrate is cut into two pieces, and the third-cut cell means that a complete substrate is cut into three pieces.

The embodiments of the present disclosure are described mainly using a half-cut cell as an example, but the embodiments of the present disclosure are not limited to the half-cut cell, and may be applied to the full cell, the third-cut cell, or the like.

In some embodiments, the solar cell includes but not limited to any one of a passivated emitter rear cell (PERC), a tunnel oxide passivated contact (TOPCon) cell, a heterojunction technology (HIT/HJT) cell, a perovskite cell, and a tandem cell. The tandem cell includes but not limited to a perovskite cell superimposed with a crystalline silicon cell, a perovskite cell superimposed with a perovskite cell, and a perovskite cell superimposed with a thin-film cell.

In the embodiments of the present disclosure, the substrate 300 is provided for collecting light and generating photo-generated carriers. First fingers 301 are disposed on a front surface 310 and have a number in a range of 70 to 150. A larger number of first fingers 301 indicates a stronger capability of collecting carriers. However, the larger number of first fingers 301 also indicates a stronger light blocking effect on the front surface 310 of the solar cell, which reduces luminous flux irradiated on the surface of the substrate 300 and reduces photo-generated carriers generated by the substrate 300. Therefore, the number of first fingers 301 is set to be in the range of 70 to 150 to make the solar cell have a specific capability of collecting carriers, and reduce the light blocking effect of the first fingers 301 on the surface of the substrate 300. Second fingers 302 are disposed on a rear surface 320 and have a number is in a range of 80 to 400. A larger number of second fingers 302 indicates a stronger capability of collecting carriers. However, a larger number of second fingers 302 indicates more consumed materials and higher costs. Therefore, the number of second fingers 302 is set to be in the range of 80 to 400 to reduce costs of the solar cell while making the solar cell have a specific capability of collecting carriers. First pad groups 303 are disposed on the front surface 310, and each first pad group 303 includes a plurality of first pads 313, so that the first pads 313 are connected to the first fingers 301 to facilitate connection between the first fingers 301 and busbars or welding strips.

Some embodiments of the present disclosure further provide a photovoltaic module. The photovoltaic module may include some embodiments of the solar cell as described above, or include all embodiments of the solar cell as described above. The photovoltaic module provided in the embodiments of the present disclosure is described below with reference to accompanying drawings. It should be noted that for parts the same as or corresponding to those in the foregoing embodiments, reference may be made to the corresponding description in the foregoing embodiments, and details are not described below.

Figure 18:
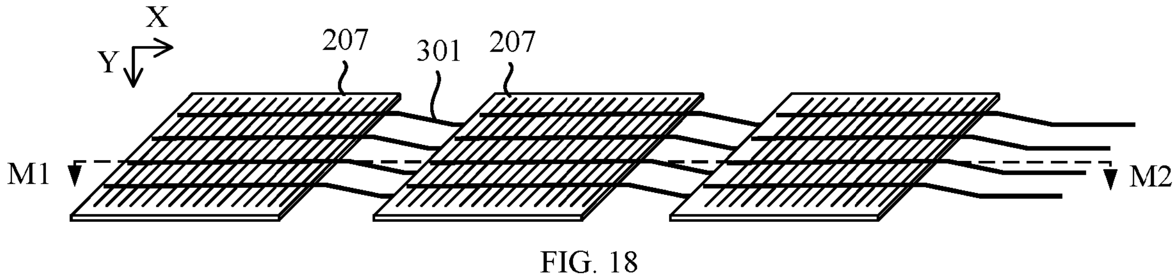
FIG. 18 is a schematic structural diagram of a photovoltaic module according to an embodiment of the present disclosure.
Figure 19:
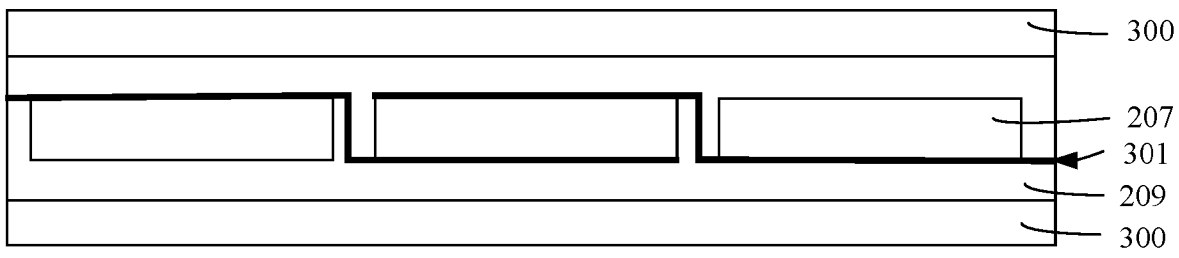
FIG. 19 is a cross-sectional view of a photovoltaic module according to an embodiment of the present disclosure.

Referring to FIG. 18 and FIG. 19, FIG. 18 is a schematic structural diagram of a photovoltaic module according to an embodiment of the present disclosure, and FIG. 19 is a cross-sectional view taken along line M1M2 in FIG. 18 according to an embodiment of the present disclosure.

In some embodiments, the photovoltaic module includes at least one cell string each formed by connecting a plurality of solar cells 407, and each solar cell 407 includes the solar cell in some or all of the foregoing embodiments.

The photovoltaic module further includes at least one encapsulation layer 409 for covering a surface of the at least one cell string.

The photovoltaic module further includes at least one cover plate 400 for covering a surface of a respective encapsulation layer 209 facing away from the at least one cell string.

In some embodiments, the encapsulation layer 409 includes a first encapsulation layer (not shown) and a second encapsulation layer (not shown). The first encapsulation layer covers one of a front surface or a rear surface of the solar cell, and the second encapsulation layer covers the other of the front surface or the rear surface of the solar cell. Specifically, at least one of the first encapsulation layer or the second encapsulation layer may be an organic encapsulation adhesive film such as a polyvinyl butyral (PVB) adhesive film, an ethylene-vinyl acetate copolymer (EVA) adhesive film, a polyolefin thermoplastic elastomer (POE) adhesive film, or a polyethylene glycol terephthalate (PET) adhesive film.

It should be understood that the first encapsulation layer and the second encapsulation layer have a parting line before a lamination process is performed. After the lamination process is performed, there is no concept of the first encapsulation layer and the second encapsulation layer in the formed photovoltaic module, that is, the first encapsulation layer and the second encapsulation layer have formed the integral encapsulation layer 209.

In some embodiments, the at least one cover plate 400 includes a cover plate with a light-transmitting function, such as a glass cover plate or a plastic cover plate. Specifically, a surface of each cover plate 400 facing the encapsulation layer 409 may be a concave-convex surface, thereby increasing the utilization rate of incident light. The at least one cover plate 400 includes a first cover plate and a second cover plate, the first cover plate is disposed on the first encapsulation layer, and the second cover plate is disposed on the second encapsulation layer.

In some embodiments, the photovoltaic module further includes at least one welding strip 401 each connecting two adjacent solar cells 407.

A person of ordinary skill in the art can understand that the foregoing embodiments are specific embodiments for implementing the present disclosure, and in an actual application, various changes can be made in terms of form and details without departing from the scope of the embodiments of the present disclosure. A person skilled in the art may make variations and modifications without departing from the scope of the embodiments of the present disclosure. Therefore, the protection scope of the embodiments of the present disclosure should be subject to the appended claims.

What is claimed is:

1. A solar cell, comprising:

a substrate including a center region and edge regions, wherein the edge regions are respectively arranged on two opposing sides of the center region;

a plurality of fingers arranged at intervals along a first direction, each of plurality of fingers extending along a second direction, the plurality of fingers including a number of fingers in the center region;

a plurality of pad groups arranged at intervals along the second direction, wherein each pad group of the plurality of pad groups includes a plurality of pads arranged at intervals along the first direction, and the plurality of pads include a number of pads in the center region that are respectively connected to the number of fingers in the center region; and a plurality of busbars arranged at intervals along the second direction, wherein each of the plurality of busbars is connected to a respective pad group of some of the plurality of pad groups, and at least one of the plurality of pad groups is disposed between two adjacent busbars of the plurality of busbars;

wherein a respective pad of the plurality of pads includes a first end portion, a body portion and a second end portion connected in sequence along the second direction, a length of each of the first end portion and the second end portion in the first direction is greater than a length of the body portion in the first direction, and a width of each of the first end portion and the second end portion in the second direction is less than a width of the body portion in the second direction.

2. The solar cell according to claim 1, wherein every two adjacent busbars of the plurality of busbars have a space therebetween with at least one of the plurality of pad groups located in the space.

3. The solar cell according to claim 2, wherein two adjacent busbars of the plurality of busbars have a first space therebetween with a single pad group of the plurality of pad groups located in the first space, and two other adjacent busbars of the plurality of busbars have a second space therebetween with at least two of the plurality of pad groups located in the second space.

4. The solar cell according to claim 1, wherein the plurality of busbars include:

first busbars, wherein a respective first busbar of the first busbars is connected to every pad of a respective pad group of the plurality of pad groups; and second busbars, wherein a respective second busbar of the second busbars is connected to some pads of a respective pad group of the plurality of pad groups.

5. The solar cell according to claim 4, wherein at least one of the plurality of pad groups is located in a space between a first busbar of the first busbars and an adjacent second busbar of the second busbars.

6. The solar cell according to claim 4, wherein each of the first busbars has a width in the second direction that is greater than a width of any of the second busbars in the second direction.

7. The solar cell according to claim 1, wherein the substrate includes a front surface and a rear surface opposite to each other, wherein both the front surface and the rear surface are provided with the plurality of fingers, the plurality of pad groups, and the plurality of busbars, and wherein at least some of the plurality of busbars on the front surface have orthographic projections on the front surface that are interleaved with orthographic projections, on the front surface, of the plurality of busbars on the rear surface.

8. The solar cell according to claim 1, wherein the substrate includes a front surface and a rear surface opposite to each other, and wherein the front surface is provided with the plurality of fingers, the plurality of pad groups, and the plurality of busbars, and the rear surface is provided with the plurality of fingers and the plurality of pad groups.

9. The solar cell according to claim 1, wherein the plurality of pad groups has a number being N, and the plurality of busbars has a number being n, wherein $N/4 \leq n < N$, and both n and N are positive integers.

10. The solar cell according to claim 1, wherein the plurality of pad groups has a number in a range of 15 to 22.

11. The solar cell according to claim 1, wherein the plurality of busbars has a number in a range of 4 to 11.

12. The solar cell according to claim 1, wherein an orthographic projection of a pad closest to one of the edge regions among the number of pads in the center region has a first area on the substrate, an orthographic projection of a pad farthest away from the edge regions among the number of pads in the center region has a second area on the substrate, and the first area is greater than the second area.

13. The solar cell according to claim 1, wherein the substrate includes a front surface and a rear surface;

wherein the plurality of fingers include:

70 to 150 first fingers disposed on the front surface; and 80 to 400 second fingers disposed on the rear surface; and wherein the plurality of pad groups include:

a plurality of first pad groups disposed on the front surface, wherein a respective pad of the plurality of pads of each of the plurality of first pad groups is connected to a respective one of the plurality of first fingers.

14. The solar cell according to claim 13, wherein each of the plurality of first fingers has a width in a range of 10 μm to 30 μm, and each of the plurality of second fingers has a width in a range of 15 μm to 50 μm.

15. The solar cell according to claim 13, wherein each of the plurality of first fingers has a height in a range of 6 μm to 30 μm, and each of the plurality of second fingers has a height in a range of 4 μm to 25 μm.

16. The solar cell according to claim 13, wherein the plurality of first pad groups have a number in a range of 12 to 26.

17. The solar cell according to claim 13, wherein the plurality of busbars include a plurality of first busbars disposed on the front surface; and wherein the plurality of first busbars are connected to the plurality of first pad groups, and at least one of the plurality of first pad groups is disposed between two adjacent first busbars of the plurality of first busbars.

18. The solar cell according to claim 17, wherein:

the plurality of pad groups further include a plurality of second pad groups disposed on the rear surface, wherein a respective pad of the plurality of pads of each of the plurality of second pad groups is connected to a respective one of the plurality of second fingers, and the plurality of first pad groups have orthographic projections on the front surface that are interleaved with orthographic projections of the plurality of second pad groups on the front surface; and the plurality of busbars include a plurality of second busbars disposed on the rear surface, wherein each of the plurality of second busbars are connected to a respective one of the plurality of second pad groups, and the plurality of first busbars have orthographic projections on the front surface that are interleaved with orthographic projections of the plurality of second busbars on the front surface.

19. A photovoltaic module, comprising:

at least one cell string each formed by connecting a plurality of solar cells, wherein each of the plurality of solar cells includes:

a substrate including a center region and edge regions, wherein the edge regions are respectively arranged on two opposing sides of the center region;

a plurality of fingers arranged at intervals along a first direction, each of plurality of fingers extending along a second direction, the plurality of fingers including a number of fingers in the center region;

a plurality of pad groups arranged at intervals along the second direction, wherein each pad group of the plurality of pad groups includes a plurality of pads arranged at intervals along the first direction, and the plurality of pads include a number of pads in the center region that are respectively connected to the number of fingers in the center region; and a plurality of busbars arranged at intervals along the second direction, wherein each of the plurality of busbars is connected to a respective pad group of some of the plurality of pad groups, and at least one of the plurality of pad groups is disposed between two adjacent busbars of the plurality of busbars;

wherein a respective pad of the plurality of pads includes a first end portion, a body portion and a second end portion connected in sequence along the second direction, a length of each of the first end portion and the second end portion in the first direction is greater than a length of the body portion in the first direction, and a width of each of the first end portion and the second end portion in the second direction is less than a width of the body portion in the second direction;

at least one welding strip each connected to two adjacent solar cells, wherein each of the at least one welding strip is connected to each of the plurality of pad groups in a respective one of the two adjacent solar cells;

at least one encapsulation layer each covering a surface of the at least one cell string; and at least one cover plate each covering a surface of a respective encapsulation layer facing away from the at least one cell string.

20. The photovoltaic module according to claim 19, wherein the plurality of solar cells in each of the at least one cell string are arranged at intervals along the first direction, and busbars in one of two adjacent solar cells in each of the at least one cell string are interleaved with busbars in the other of the two adjacent solar cells in the second direction.

* * * * *